US010121552B1

(12) United States Patent
Baraskar et al.

(10) Patent No.: US 10,121,552 B1
(45) Date of Patent: Nov. 6, 2018

(54) REDUCING CHARGE LOSS IN DATA MEMORY CELL ADJACENT TO DUMMY MEMORY CELL

(71) Applicant: SanDisk Technologies LLC, Plano, TX (US)

(72) Inventors: Ashish Baraskar, Santa Clara, CA (US); Liang Pang, Fremont, CA (US); Yingda Dong, San Jose, CA (US); Ching-Huang Lu, Fremont, CA (US); Nan Lu, San Jose, CA (US); Hong-Yan Chen, Sunnyvale, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 17 days.

(21) Appl. No.: 15/495,178

(22) Filed: Apr. 24, 2017

(51) Int. Cl.
| *G11C 16/04* | (2006.01) |
| *G11C 16/34* | (2006.01) |
| *G11C 16/28* | (2006.01) |
| *G11C 16/16* | (2006.01) |
| *G11C 16/32* | (2006.01) |
| *G11C 16/08* | (2006.01) |

(52) U.S. Cl.
CPC ...... *G11C 16/3427* (2013.01); *G11C 16/0483* (2013.01); *G11C 16/08* (2013.01); *G11C 16/16* (2013.01); *G11C 16/28* (2013.01); *G11C 16/32* (2013.01); *G11C 16/3459* (2013.01)

(58) Field of Classification Search
CPC . G11C 16/3427; G11C 16/0483; G11C 16/08; G11C 16/16; G11C 16/28; G11C 16/32; G11C 16/3459

USPC ........................................ 365/185.02, 185.17
See application file for complete search history.

(56) References Cited

U.S. PATENT DOCUMENTS

| 7,447,086 | B2 | 11/2008 | Wan et al. | |
| 7,715,235 | B2 | 5/2010 | Cernea | |
| 8,243,522 | B2 | 8/2012 | Bicksler | |
| 8,488,386 | B2 * | 7/2013 | Kim ...................... | G11C 16/10 365/185.18 |
| 8,526,233 | B2 | 9/2013 | Hernink et al. | |
| 9,293,180 | B2 | 3/2016 | Jeong et al. | |
| 9,336,892 | B1 | 5/2016 | Chen et al. | |
| 9,396,791 | B2 | 7/2016 | Raghunathan et al. | |
| 9,466,369 | B1 | 10/2016 | Pang et al. | |
| 9,530,506 | B2 | 12/2016 | Rabkin et al. | |
| 9,620,233 | B1 | 4/2017 | Dong et al. | |
| 2013/0314995 | A1 | 11/2013 | Dutta et al. | |

* cited by examiner

*Primary Examiner* — Huan Hoang
(74) *Attorney, Agent, or Firm* — Vierra Magen Marcus LLP

(57) ABSTRACT

A memory device and associated techniques to reduce charge loss of memory cells. In one aspect, a charge loss countermeasure is performed if a word line selected for programming is adjacent to a dummy word line. The countermeasure can involve programming the dummy memory cells through injection disturb. In one approach, the timing is adjusted for the voltages on the selected word line and the dummy word line at the end of a program voltage. The selected word line voltage can be decreased more quickly, or the dummy word line voltage can be decreased more slowly. The decrease of the dummy word line voltage can also be delayed. Another approach involves elevating the bit line voltage during the decrease of the selected word line voltage. The bit line voltage can be a function of the assigned data state of a selected cell.

10 Claims, 23 Drawing Sheets

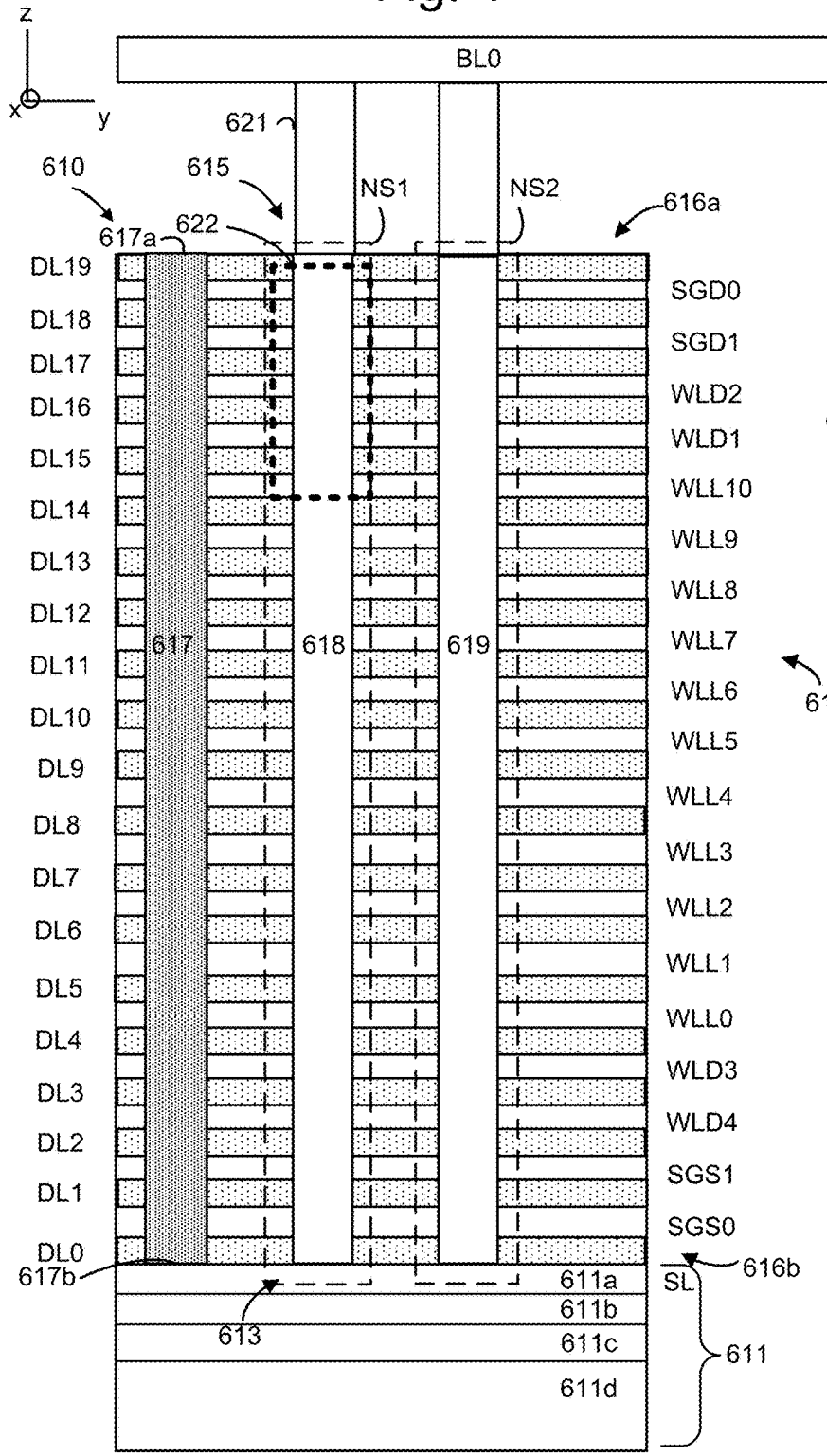
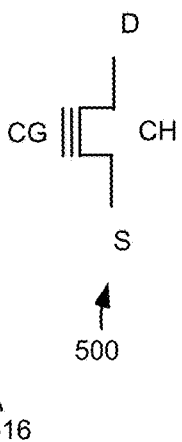
Fig. 4
Fig. 5

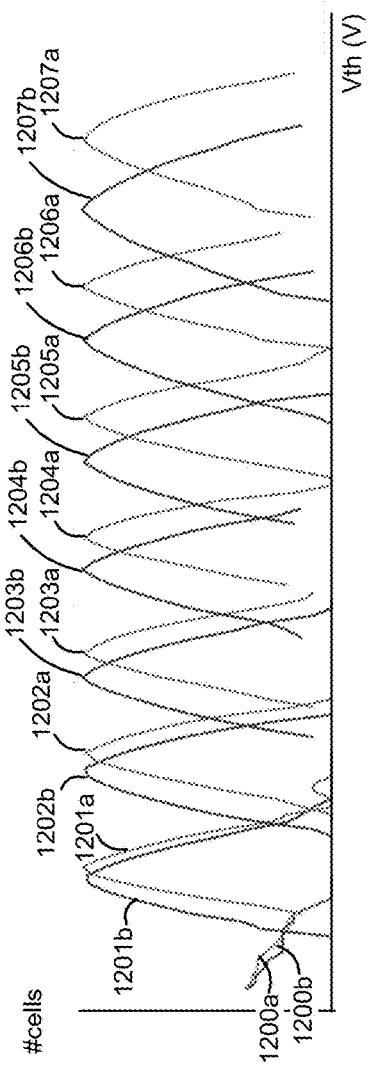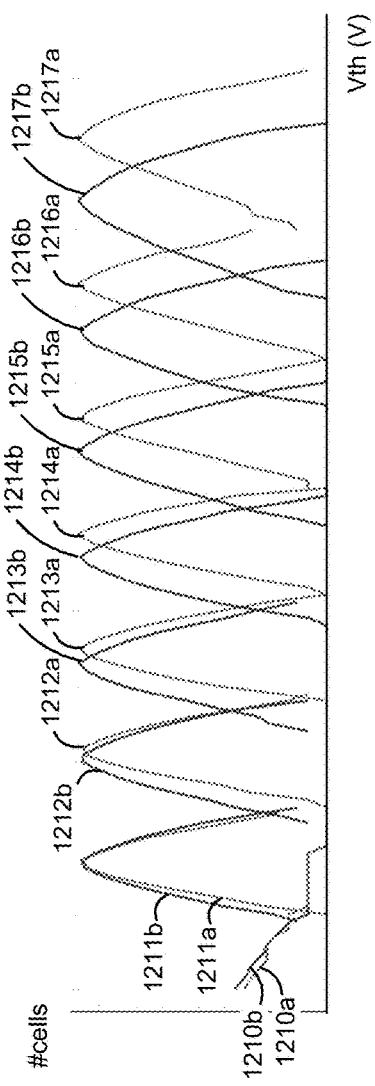

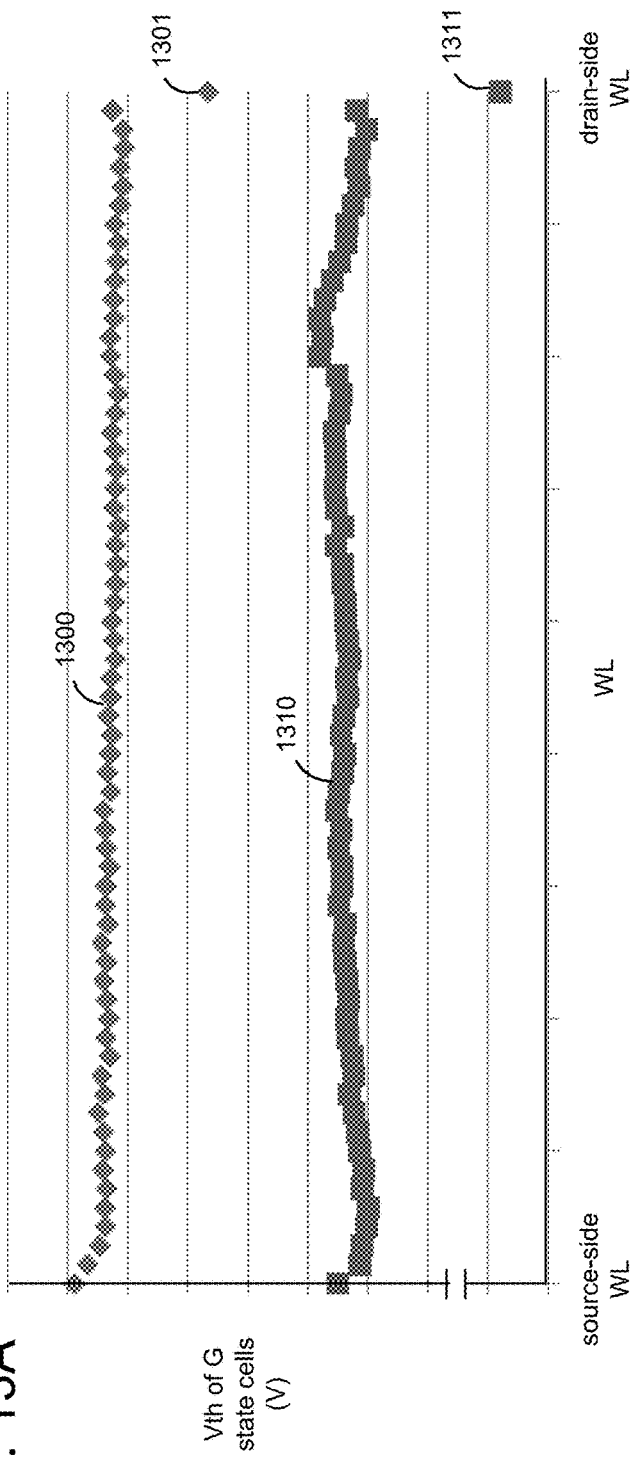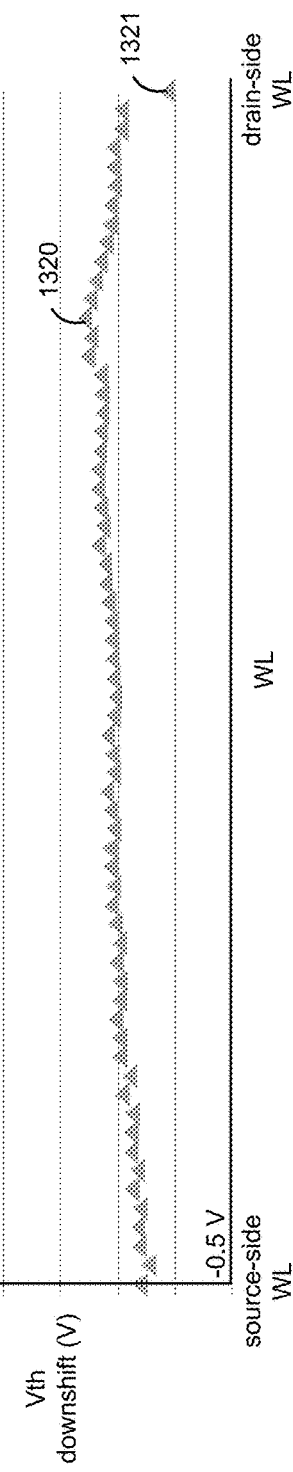
Fig. 13A
Fig. 13B

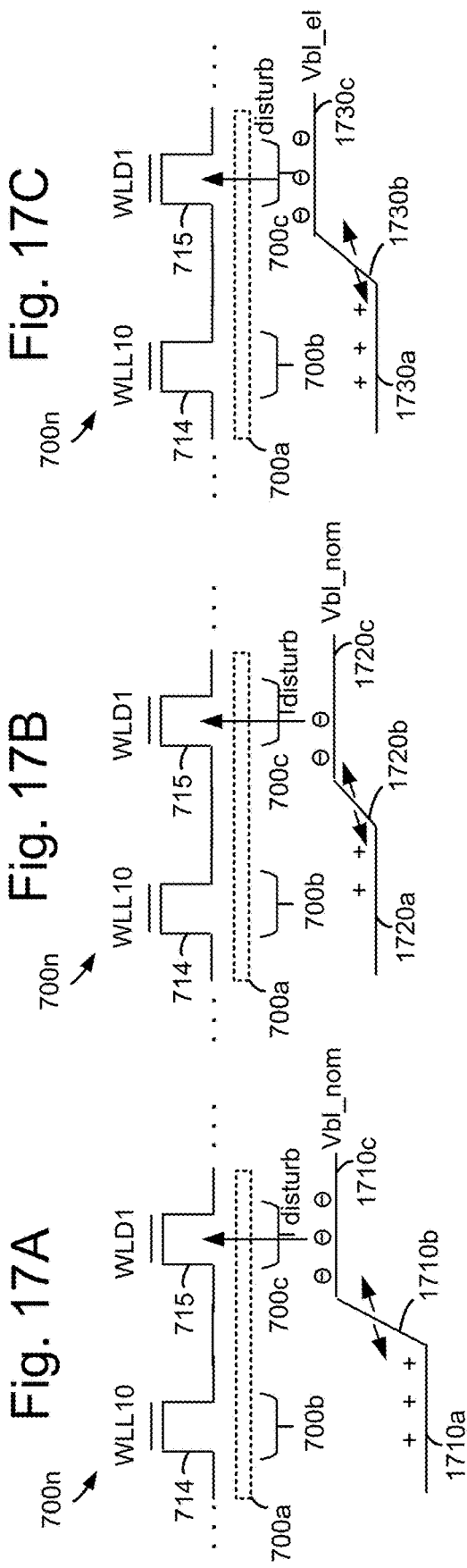

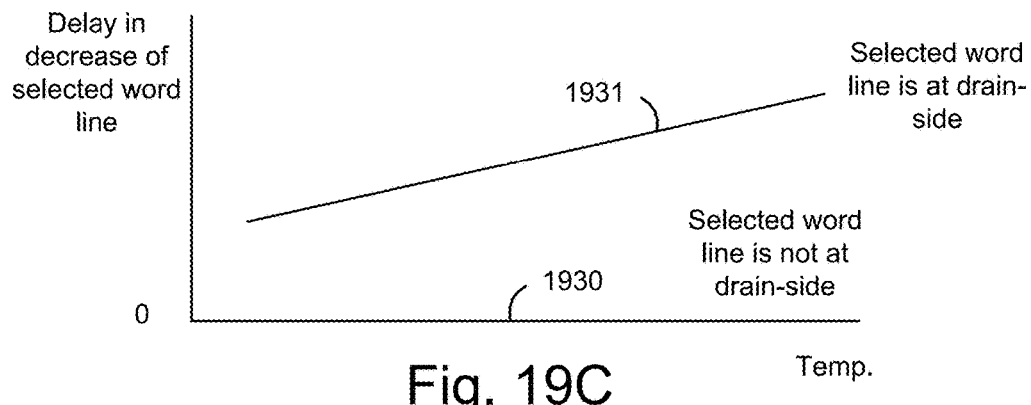
Fig. 19C
Fig. 20A
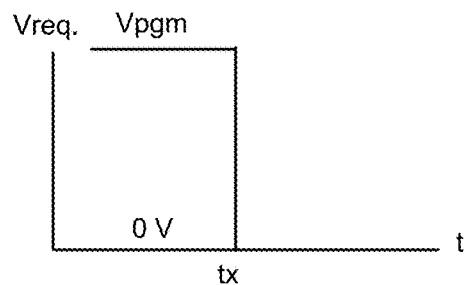
Fig. 20B
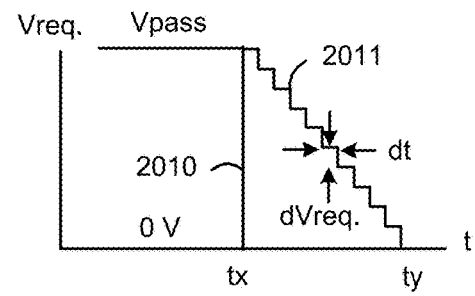
Fig. 20C
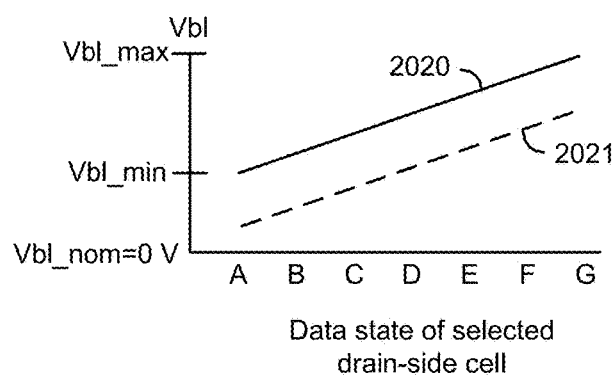

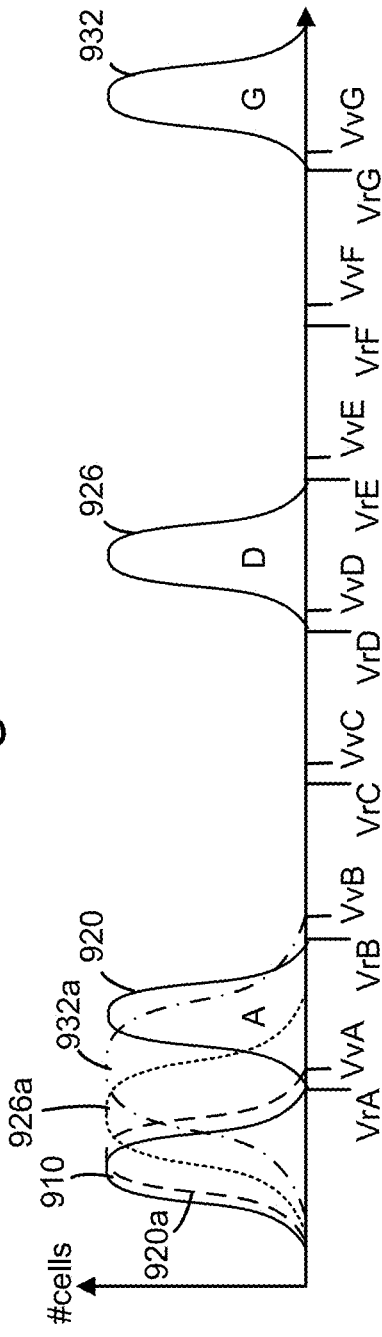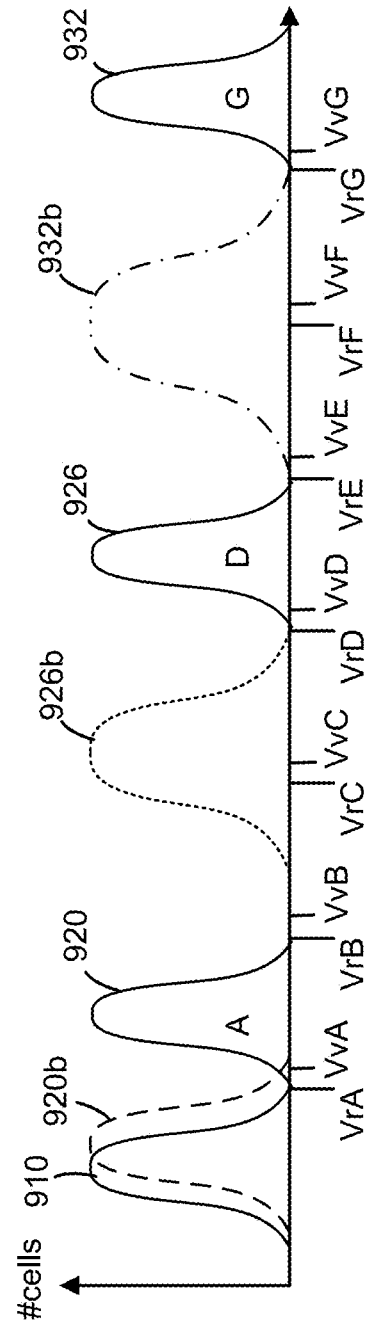

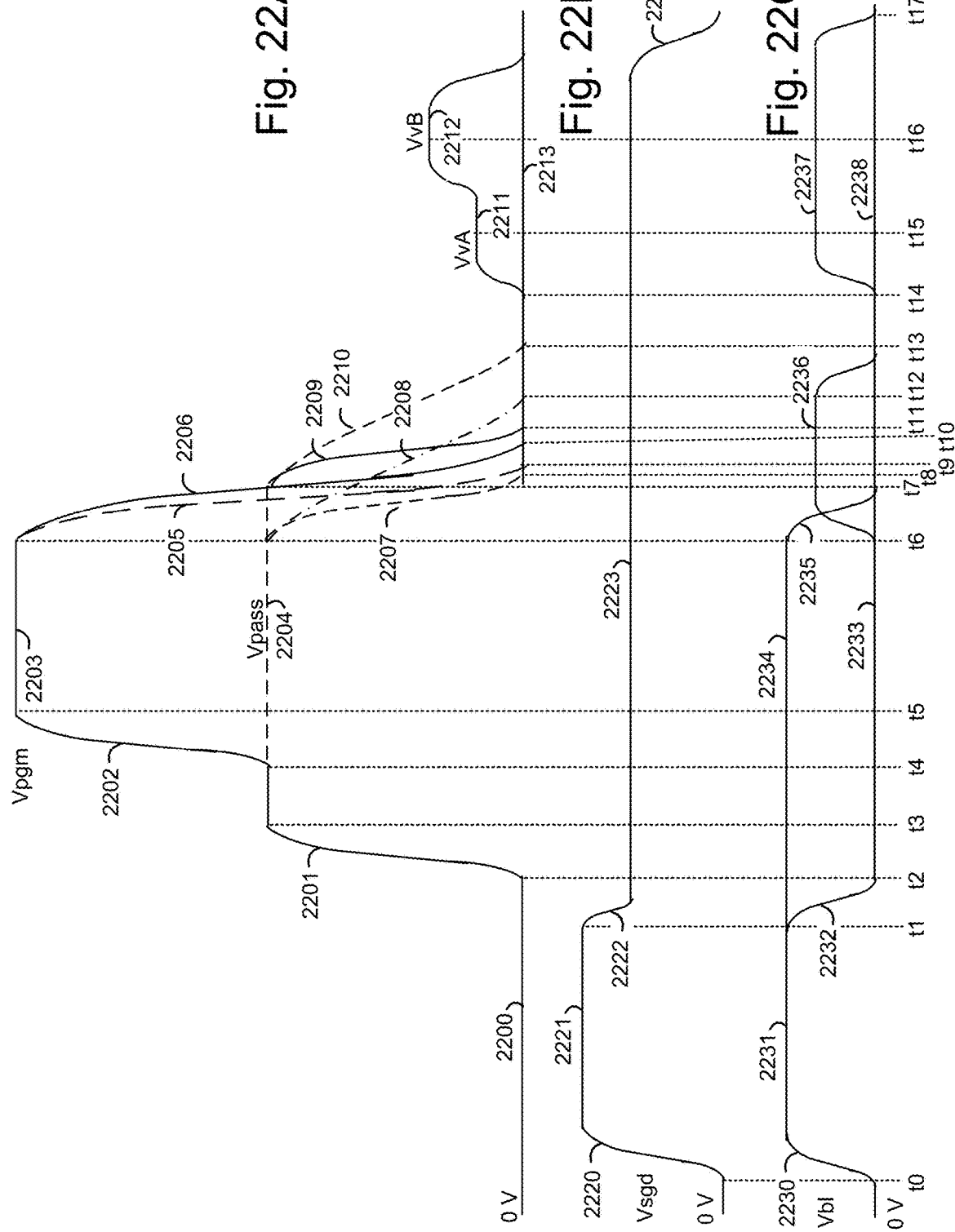

REDUCING CHARGE LOSS IN DATA MEMORY CELL ADJACENT TO DUMMY MEMORY CELL

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the memory string to selectively connect a channel of the memory string to a source line or bit line. However, various challenges are presented in operating such memory devices.

BRIEF DESCRIPTION OF THE DRAWINGS

FIG. 4 depicts an example cross-sectional view of a portion of one of the blocks of FIG. 3.

FIG. 5 depicts an example transistor 500.

FIG. 12A depicts an example Vth distribution of a set of data memory cells connected to a word line, before and after charge loss, when the adjacent dummy memory cells are erased.

FIG. 12B depicts an example Vth distribution of a set of data memory cells connected to a word line, before and after charge loss, when the adjacent dummy memory cells are programmed.

FIG. 13A depicts a plot of the Vth of G state cells with and without charge loss, as a function of word line position.

FIG. 13B depicts a plot of a change in Vth due to charge loss in FIG. 13A, as a function of word line position.

FIG. 17A depicts an example of channel voltages associated with the memory cells 714 and 715 of FIGS. 7 and 14, with the charge loss countermeasure of steps 1615-1615c or 1635-1635c of FIGS. 16B and 16C, respectively, and where the memory cell 714 is being programmed to the G state and a nominal bit line voltage is used.

FIG. 17B depicts an example of channel voltages associated with the memory cells 714 and 715 of FIGS. 7 and 14, and with the charge loss countermeasure of steps 1615-1615c or 1635-1635c of FIGS. 16B and 16C, respectively, where the memory cell 714 is being programmed to the A state and a nominal bit line voltage is used.

FIG. 17C depicts an example of channel voltages associated with the memory cells 714 and 715 of FIGS. 7 and 14, and with the charge loss countermeasure of steps 1615-1615d or 1635-1635d of FIGS. 16B and 16C, respectively, where the memory cell 714 is being programmed to the A state and an elevated bit line voltage is used.

FIG. 19C depicts a plot showing a delay in the decrease of a dummy word line voltage versus temperature, for the case of the selected word line not being at the drain-side of a memory string (plot 1930) and for the case of the selected word line being at the drain-side of a memory string (plot 1931).

FIG. 20A depicts a plot of a step change in a requested voltage (Vreq.) of a selected word line.

FIG. 20B depicts a plot of a requested voltage (Vreq.) of a dummy word line, for the case of a step change (plot 2010) and for the case of a ramp change (plot 2011).

FIG. 20C depicts a plot of a bit line voltage as a function of a data state of a selected cell, for use as a charge loss countermeasure, consistent with steps 1602, 1615 and 1635 of FIGS. 16A, 16B and 16C, respectively.

FIG. 21A depicts example Vth distributions of A, D and G state cells of a selected word line and of dummy memory cells of an adjacent dummy word line, where a charge loss countermeasure is not used so that the dummy memory cells are not significantly programmed.

FIG. 21B depicts example Vth distributions of A, D and G state cells of a selected word line and of dummy memory cells of an adjacent dummy word line, where a charge loss countermeasure is used so that the dummy memory cells are significantly programmed.

FIG. 22A depicts example waveforms of word lines in a programming operation.

FIG. 22B depict example waveforms for SGD transistors in a programming operation, consistent with FIG. 22A.

FIG. 22C depicts example waveforms for bit lines in a programming operation, consistent with FIG. 22A.

DETAILED DESCRIPTION

Figure 1A:
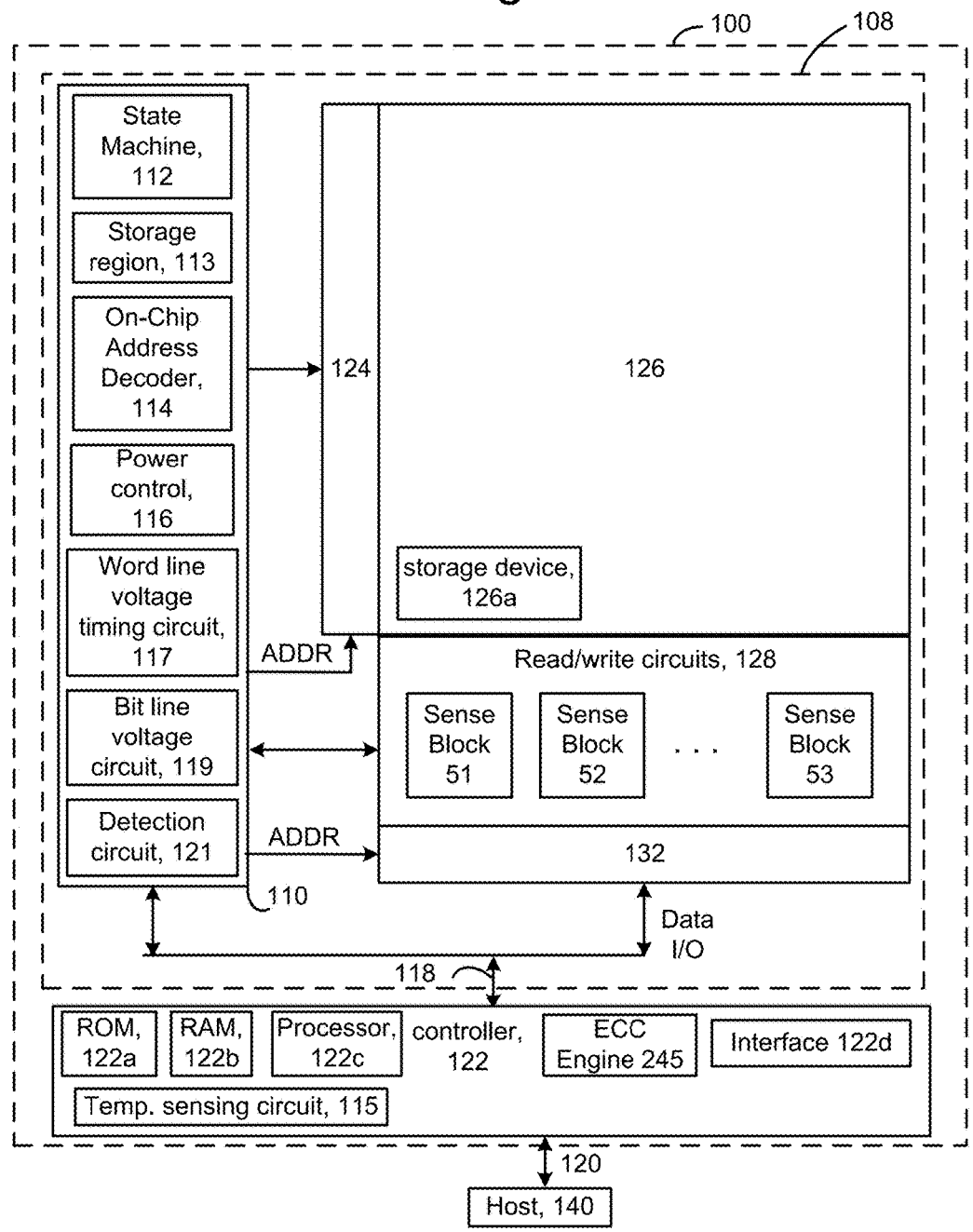
FIG. 1A is a block diagram of an example memory device.

Apparatuses and techniques are described for reducing charge loss of memory cells after they are programmed.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a memory string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When new data is to be written to a block, the block is erased. This involves boosting the channel voltage while holding the control gates of the memory cells at a low voltage such as 0 V. Various approaches can be used to boost the channel voltage. One approach raises the voltage of a substrate at a source end of the memory strings. Additionally, the control gate voltage of a source side select gate transistor (SGS transistor) of each memory string is controlled to allow holes (positive charges) to enter the channel.

However, after the cells are programmed, they can experience charge loss. This lowers the threshold voltage of the cells and can cause an error in the data stored in the cells. For a given cell, charges can travel laterally along the charge trapping layer to an adjacent cell. Or, charges can travel out of the charge trapping layer, such as to the control gate or channel of the cell. This is referred to as vertical charge movement, where the direction of the charge trapping layer is considered to be horizontal. The lateral charge loss of a selected cell is greater when there is a greater lateral electric field. This occurs when the adjacent cells are at a lower Vth than the selected cell. The vertical charge loss of a selected cell is greater when there is a greater vertical electric field. This occurs when the selected cell has a relatively high Vth. Moreover, charge loss is particularly significant for cells of the drain-side word line, which are adjacent to dummy memory cells, due to the low Vth of the dummy memory cells. Charge loss is also referred to as data retention loss. Data retention is the ability of a cell to retain the Vth level to which it was programmed.

Techniques provided herein address the above and other issues. In one aspect, a charge loss countermeasure is performed if a word line selected for programming is adjacent to a dummy word line. The charge loss countermeasure can involve increasing an injection disturb of the dummy memory cells by increasing the magnitude of a voltage gradient in the channel between the data memory cells and the dummy memory cells. In one approach, the timing is adjusted for the decreasing of the voltages on the selected word line and/or the dummy word line at the end of a program voltage or pulse. The selected word line voltage can be decreased more quickly, or the dummy word line voltage can be decreased more slowly, compared to the nominal timing which is used when the selected word line is not adjacent to a dummy word line. The decrease of the dummy word line voltage can be delayed compared to the nominal timing. Another approach involves elevating the bit line voltage during the decrease of the selected word line voltage. The bit line voltage can be a function of the assigned data state of a selected cell, to adaptively adjust the voltage gradient in the channel to the assigned data state.

The timing adjustment and the bit line voltage adjustment can be performed together, or only one of them can be performed, for example. Advantages include reduced charge loss. Also, since the programming of the dummy memory cells occurs during the program operation for the selected memory cells, there is no time penalty of an extra dedicated program operation for the dummy memory cells.

These and other features are discussed herein.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114, a power control circuit 116, a word line voltage timing circuit 117, a bit line voltage circuit 119 and a detection circuit 121. The state machine 112 provides chip-level control of memory operations. In one embodiment, the state machine is programmable by the software. In other embodiments, the state machine does not use software and is completely implemented in hardware (e.g., electrical circuits). The storage region 113 may be provided, e.g., for operational parameters and software/code.

The on-chip address decoder 114 provides an address interface between that used by the host or a memory controller to the hardware address used by the decoders 124 and 132. The power control circuit 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

The timing circuit 117 can be used to control the timing of voltages by the power control circuit. In one approach, the timing of voltages for a selected word line and a dummy word line can be set based on whether these word lines are adjacent, that is, based on whether or not a charge loss countermeasure is to be performed for the cells of the selected word line. In one embodiment, the timing can include the time of the start of the decrease of the voltage and the duration of the decrease of the voltage from the starting level to the final level.

The bit line voltage circuit 119 can be used to adjust the level of bit line voltages by the power control circuit. In one approach, the voltage level for each bit line can be set based on whether a charge loss countermeasure is to be performed for the cells of the selected word line.

The detection circuit 121 can be used to identify a selected word line or memory cell. For example, the controller 122 may provide a command which instructs the control circuitry 110 to program data into a particular word line. The detection circuit can analyze the address of the word line in the command and determine if it matches the address of a particular word line, such as a drain-side data word line which is adjacent to a dummy word line. If there is a match, a charge loss countermeasure is performed for the cells of the selected word line. The detection circuit can then signal the timing circuit and/or the bit line voltage circuit. In response to the signal, the timing circuit adjusts the timing of the selected word line and/or dummy word line voltages and the bit line voltage circuit adjusts the bit line voltage.

In one approach, if the address of the word line in the command does not match the address of a particular word line for which a charge loss countermeasure is performed, the detection circuit does not signal the timing circuit and the bit line voltage circuit regarding a charge loss countermeasure.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 116, timing circuit 117, bit line voltage circuit 119, detection circuit 121, sense blocks 51, 52, . . . , 53, read/write circuits 128, controller 122, and so forth.

The controller 122 may also include a temperature-sensing circuit 115 which is used by the processor 122c to adjust a charge loss countermeasure based on temperature. See FIG. 1B. For example, the controller may include the temperature in a program command which it provides to the control circuitry 110. The timing circuit can use the temperature to adjust the timing of the selected word line and/or dummy word line voltages during the charge loss countermeasure. The bit line voltage circuit can also use the temperature to adjust the bit line voltage.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a memory string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
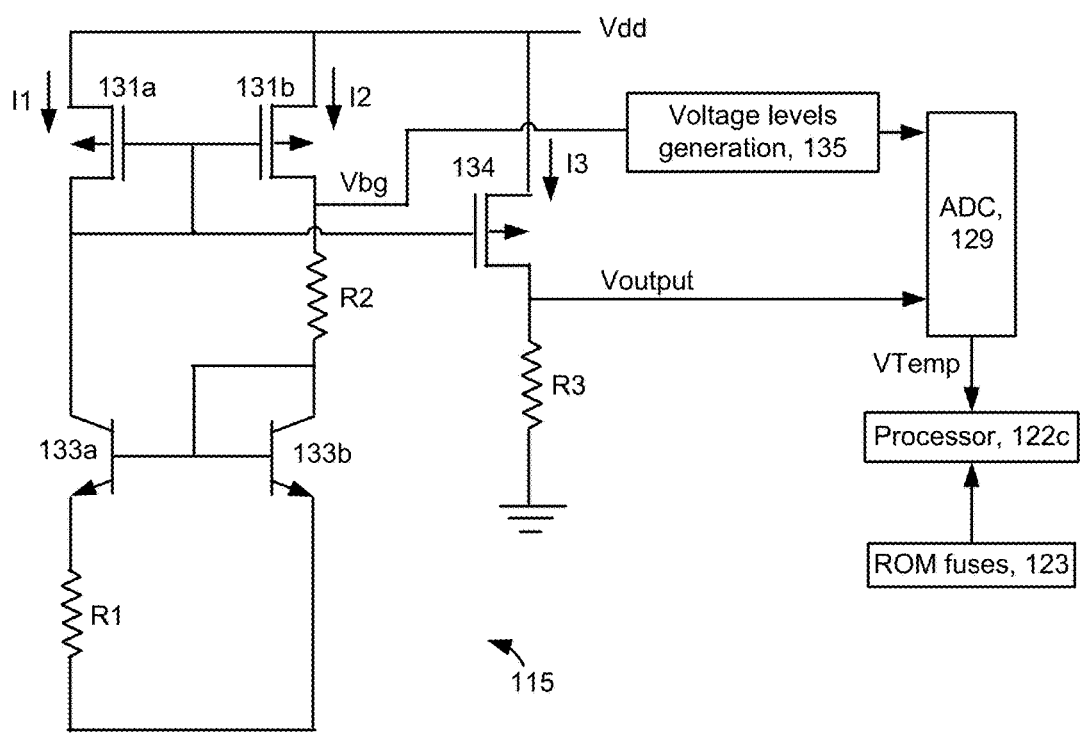
FIG. 1B depicts an example of the temperature-sensing circuit 115 of FIG. 1A.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
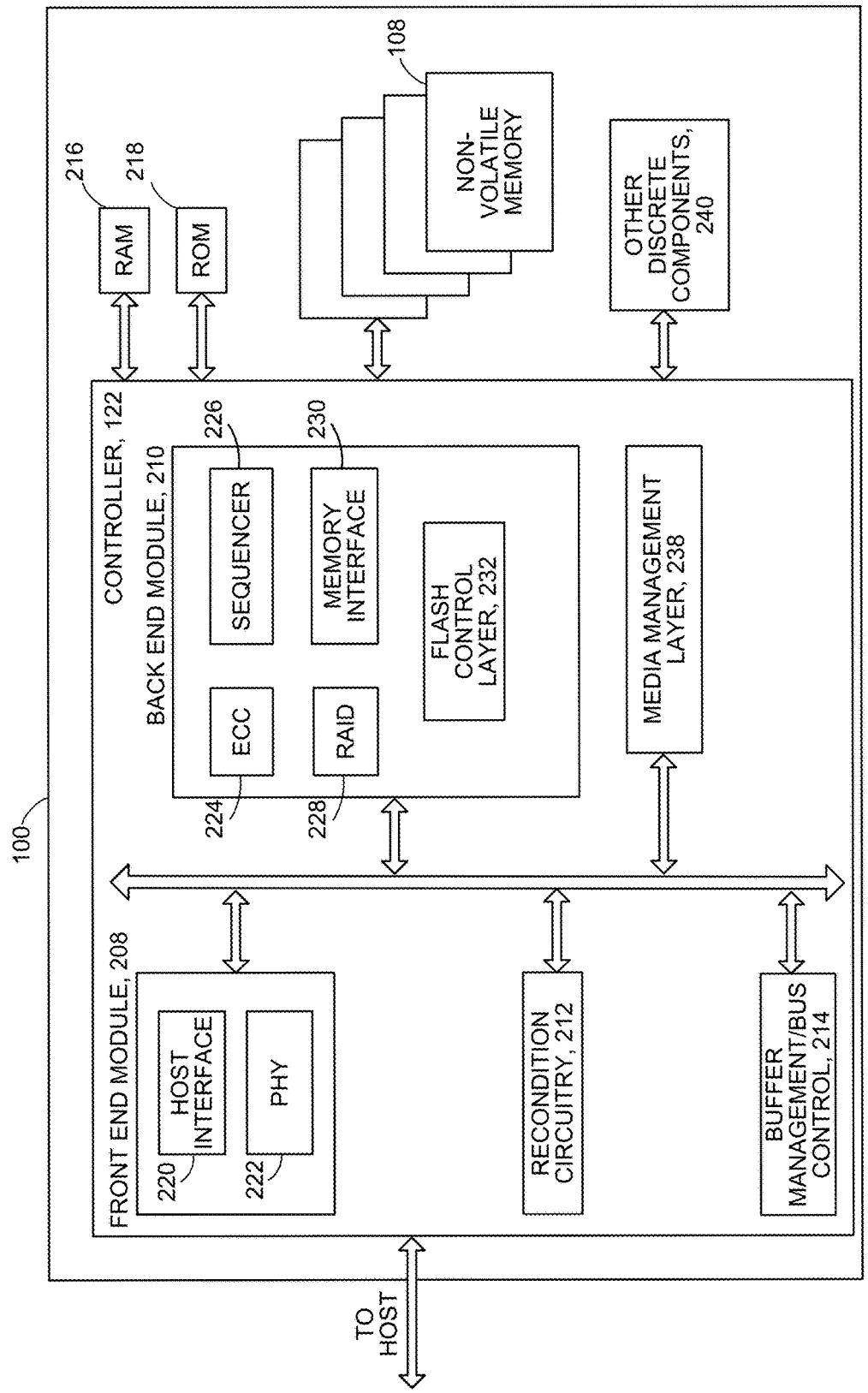
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include Media Management Layer (MML) 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, MML 238 and buffer management/bus controller 214 are optional components that are not necessary in the Controller 122.

The Flash Translation Layer (FTL) or MML 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
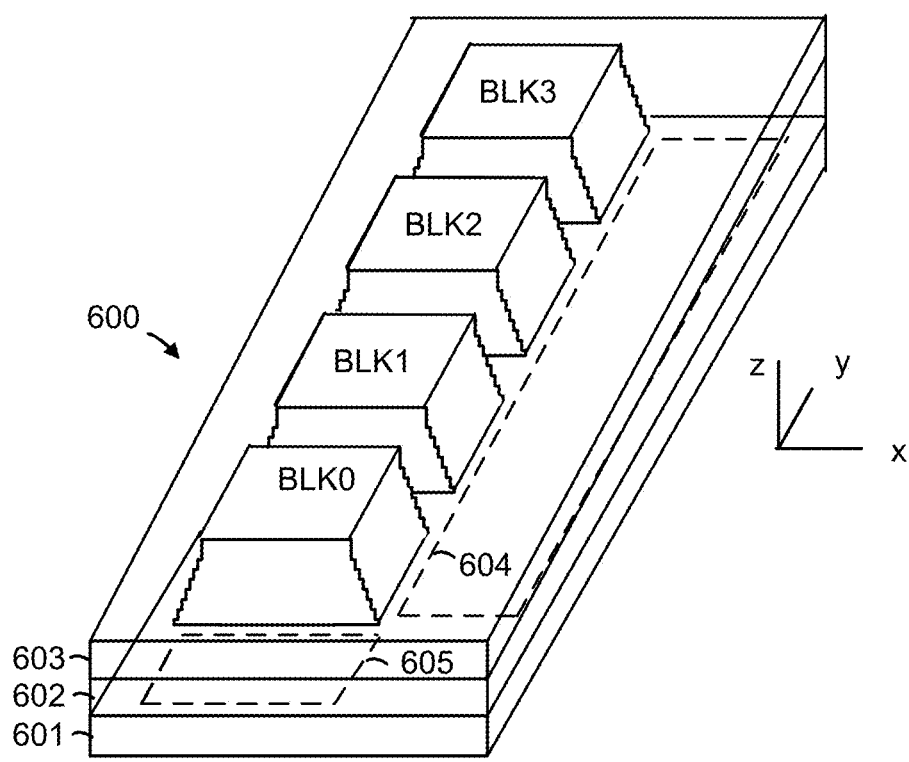
FIG. 3 is a perspective view of a memory device 600 comprising a set of blocks in an example 3D configuration of the memory structure 126 of FIG. 1A.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. Voltage detectors for bit lines may be located in this peripheral area 605, in one approach. In this case, the blocks BLK0, BLK1, BLK2 and BLK3 are at progressively further distances from the voltage detectors.

The circuitry can include voltage drivers which can be connected to control gate layers, bit lines and source lines of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Local interconnects, such as interconnect 617, may be provided periodically across the stack. The local interconnects may be metal-filled slits which extend through the stack, such as to connect the source line/substrate to a line above the stack. The slits may be used during the formation of the word lines and subsequently filled with metal. A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is in contact with the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

FIG. 5 depicts an example transistor 500. The transistor comprises a control gate CG, a drain D, a source S and a channel CH.

Figure 6:
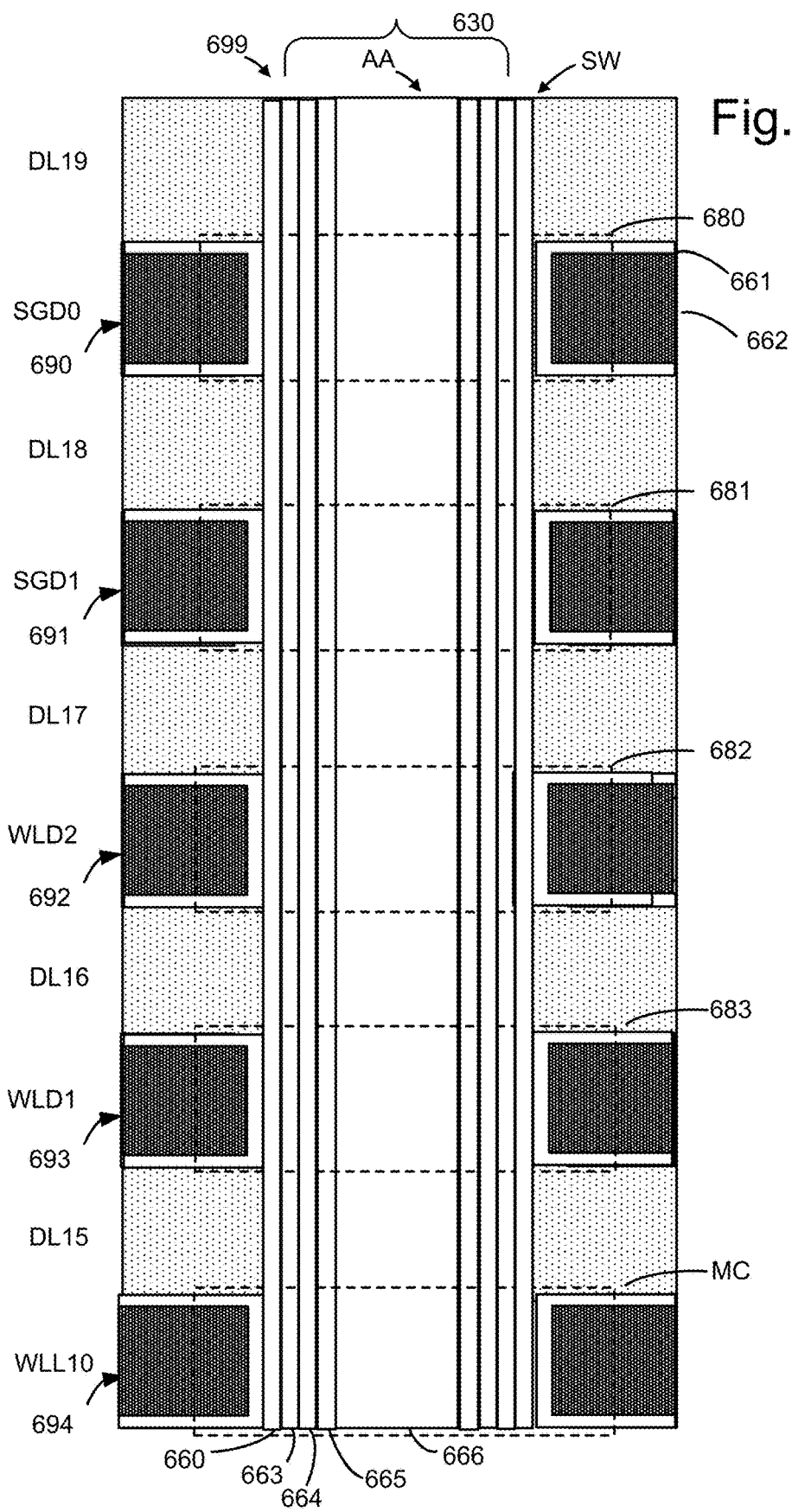
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 660, charge-trapping layer 663 or film such as silicon nitride ($Si_3N_4$) or other nitride, a tunneling layer 664 (e.g., oxide), a channel layer 665 (e.g., comprising polysilicon), and a dielectric core 666. A word line layer can include a metal barrier 661, and a conductive metal 662 such as Tungsten as a control gate, for instance. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
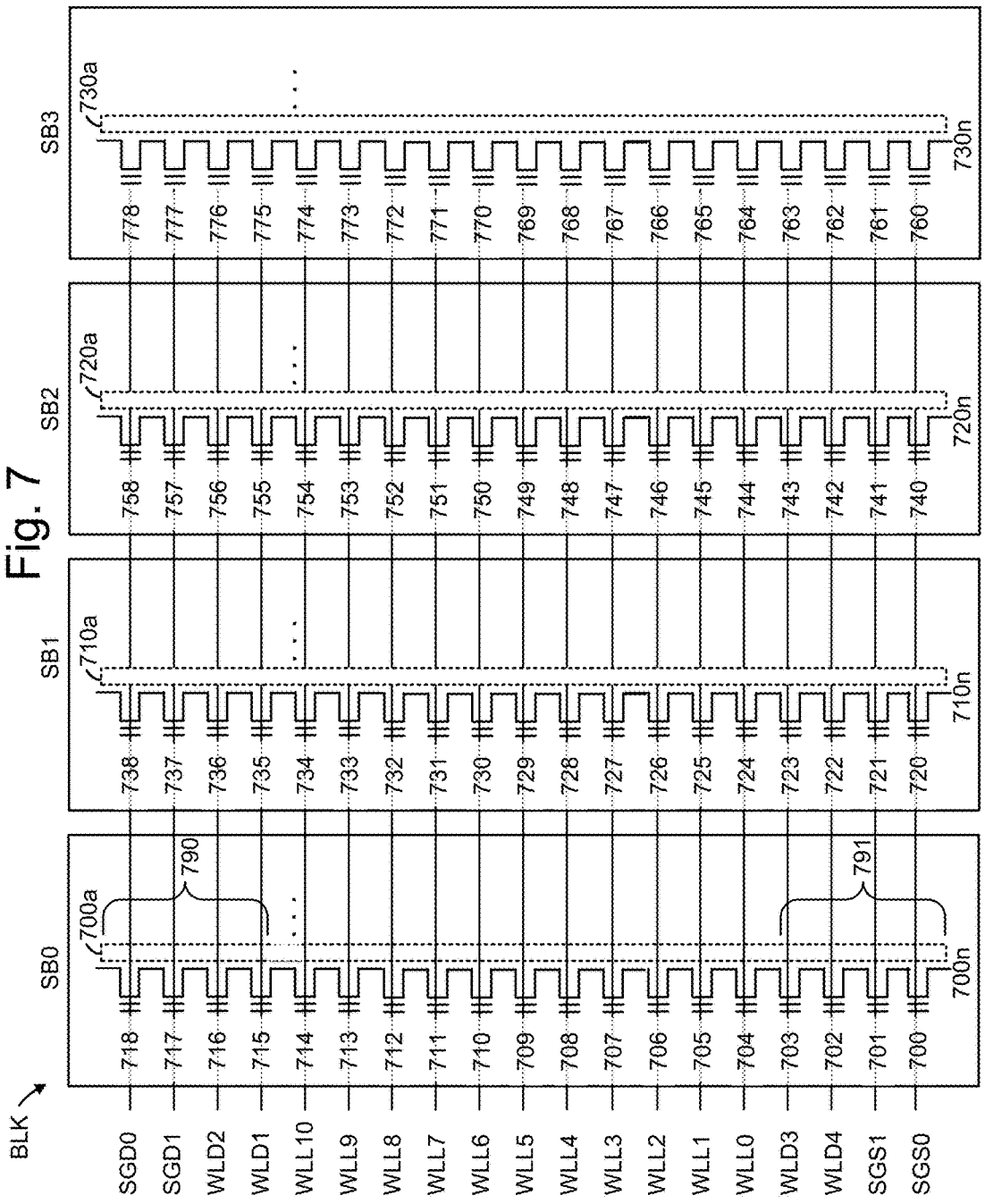
FIG. 7 depicts an example view of NAND strings in sub-blocks in a 3D configuration which is consistent with FIG. 4.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively. Each channel has a drain end and a source end. For example, the channel 700a has a drain end 790 and a source end 791.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 8:
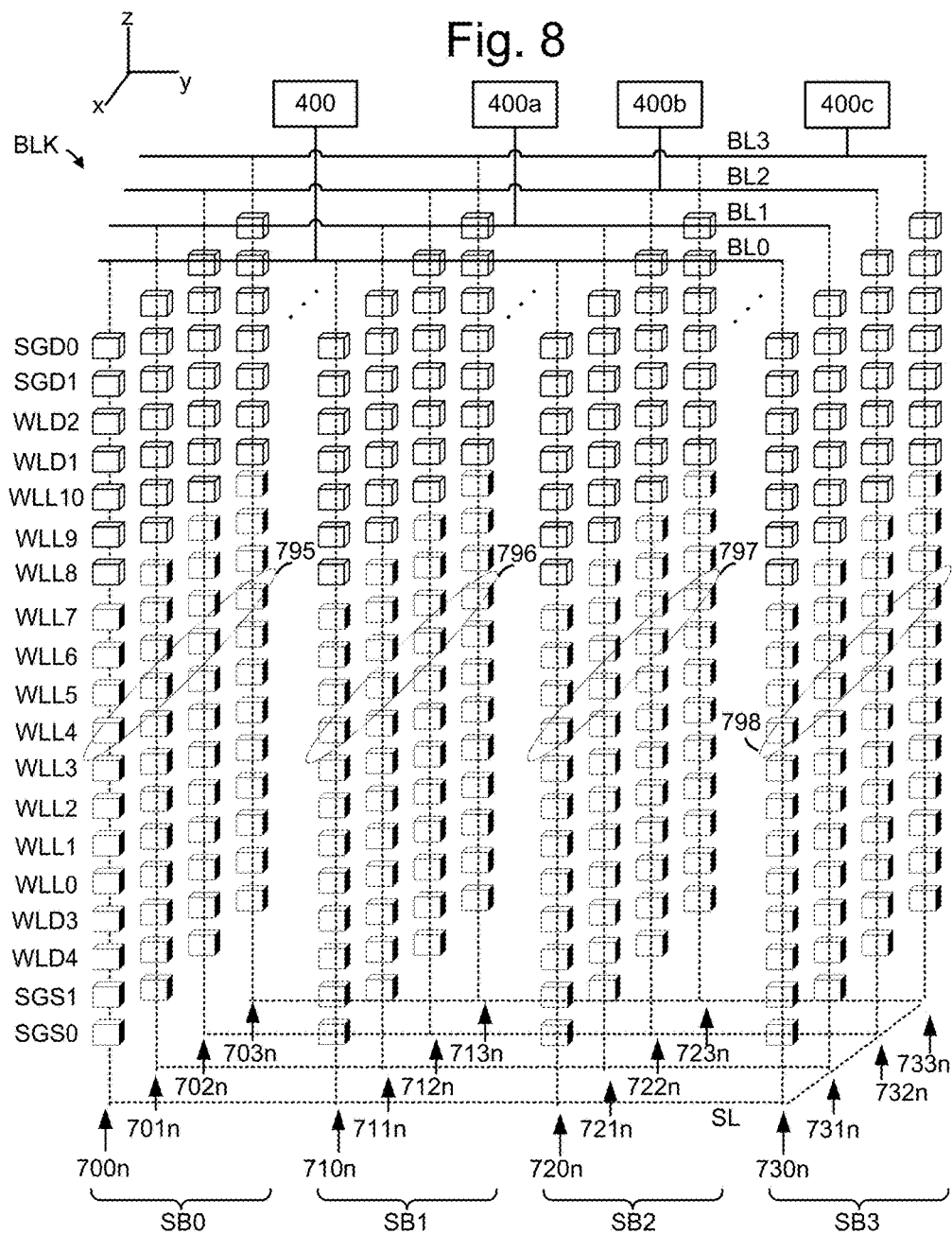
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. Generally, a voltage source is used to provide a voltage on the local interconnect. However, some time is needed for the voltage to increase to a commanded level due to the large capacitance of the p-well. A voltage detector can be connected to the local interconnect or the substrate to measure the substrate voltage.

Sense circuits 400, 400a, 400b and 400c are connected to BL0, BL1, BL2 and BL3, respectively.

Figure 9:
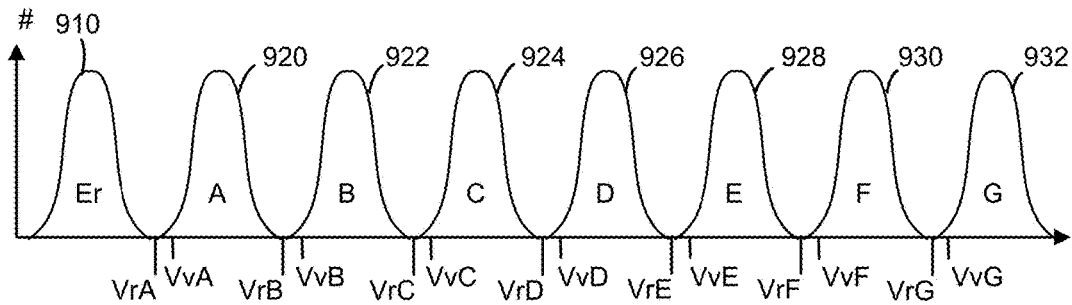
FIG. 9 depicts an example Vth distribution of a set of memory cells connected to a word line, after a programming operation, where eight data states are used.

FIG. 9 depicts an example Vth distribution of a set of memory cells connected to a word line, after a programming operation, where eight data states are used. The vertical axis depicts a number of cells on a logarithmic scale and the horizontal axis depicts Vth. A Vth distribution 910 represents erased (Er) state memory cells. Vth distributions 920, 922, 924, 926, 928, 930 and 932 represent assigned data states A, B, C, D, E, F and G, respectively, which are reached by memory cells when their Vth exceeds the verify voltages VvA, VvB, VvC, VvD, VvE, VvF and VvG, respectively. This example uses eight data states. Other numbers of data states can be used as well, such as four or sixteen. Read voltages VrA, VrB, VrC, VrD, VrE, VrF and VrG are used to read data from a set of cells having this Vth distribution. An erase verify voltage VvEr is used in an erase-verify test to determine whether an erase operation is completed.

Figure 10:
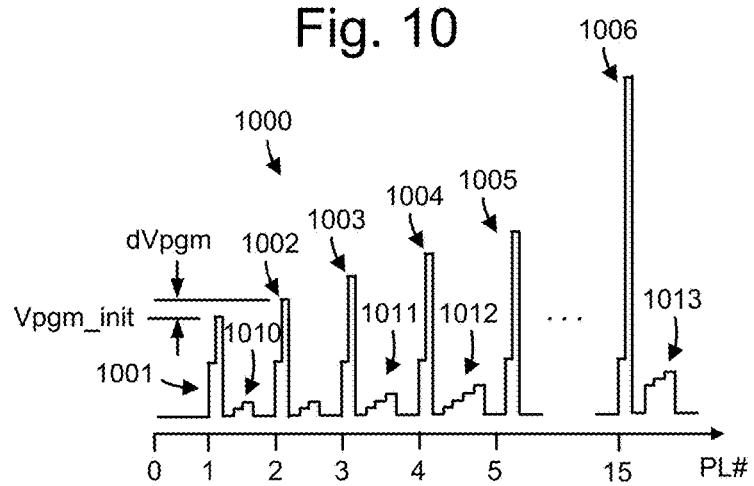
FIG. 10 depicts a waveform of an example programming operation comprising incremental step pulse programming (ISPP).

FIG. 10 depicts a waveform of an example programming operation comprising incremental step pulse programming (ISPP), where Vpgm_init is an initial program voltage and dVpgm is a step size. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 9.

Each program voltage includes two steps, in one approach. Further, ISPP is used in this example, in which the program voltage steps up in each successive program loop using a fixed or varying step size. This example uses ISPP in a single programming pass in which the programming is completed. ISPP can also be used in each programming pass of a multi-pass operation.

The waveform 1000 includes a series of program voltages 1001, 1002, 1003, 1004, 1005, . . . 1006 that are applied to a word line selected for programming and to an associated set of non-volatile memory cells. The series of program voltages begins with an initial program voltage of Vpgm_init. Each successive program voltage may increase by a step size dVpgm. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1010) may be applied after each of the program voltages 1001 and 1002. A-, B- and C-state verify voltages of VvA, VvB and VvC (waveform 1011) may be applied after the program voltage 1003. A-, B-, C- and D-state verify voltages of VvA, VvB, VvC, VvD (waveform 1012) may be applied after the program voltage 1004. After additional program loops, E-, F- and G-state verify voltages of VvE, VvF and VvG (waveform 1013) may be applied after the final program voltage 1006.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read voltages, the system can determine the data state which is represented by a memory cell. These read voltages are demarcation voltages because they demarcate between Vth ranges of different data states.

Further details of a program voltage are provided in FIG. 22A-22C.

Figure 11A:
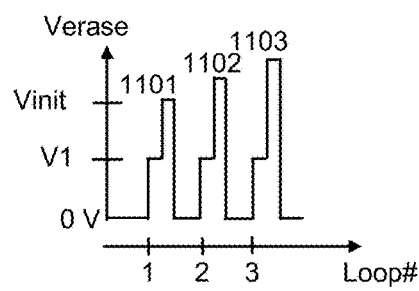
FIG. 11A depicts a plot of example erase voltages applied to a substrate in an erase operation.

FIG. 11A depicts a plot of example erase voltages applied to a substrate in an erase operation. The vertical axis depicts Verase and the horizontal axis depicts the erase loop number. Verase has an initial magnitude of Vinit and steps up in magnitude in each successive erase loop. A total of three loops are used to complete the erase operation in this example. Erase voltages 1101, 1102 and 1103 are applied in the erase loops 1, 2 and 3, respectively. Verase is the voltage applied to the substrate via the local interconnect.

Figure 11B:
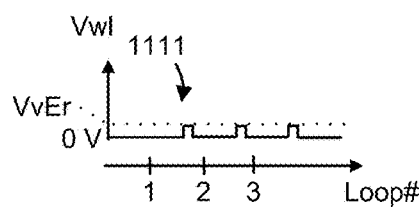
FIG. 11B depicts a plot of erase verify voltages applied to word lines in a block, consistent with FIG. 11A.

FIG. 11B depicts a plot of erase verify voltages applied to word lines in a block, consistent with FIG. 11A. The vertical axis depicts Vwl (word line voltage) and the horizontal axis depicts the erase loop number. An example erase verify voltage 1111 is depicted. This voltage (VvEr) may have a magnitude near 0 V, for example. An erase verify voltage is typically applied after each erase voltage as part of an erase verify test of a block.

FIG. 12A depicts an example Vth distribution of a set of data memory cells connected to a word line, before and after charge loss, when the adjacent dummy memory cells are erased. In FIGS. 12A and 12B, the vertical axis depicts a number of cells on a logarithmic scale and the horizontal axis depicts Vth. As mentioned, charge loss results in a decrease in the Vth of memory cells over time. The Vth distributions 1200*a*, 1201*a*, 1202*a*, 1203*a*, 1204*a*, 1205*a*, 1206*a* and 1207*a* represent the erased state and the assigned data states A, B, C, D, E, F and G, respectively, with no charge loss. This is the case immediately after the cells are programmed. The Vth distributions 1200*b*, 1201*b*, 1202*b*, 1203*b*, 1204*b*, 1205*b*, 1206*b* and 1207*b* represent the erased state and the assigned data states A, B, C, D, E, F and G, respectively, with charge loss. This is the case after some time has passed after programming, e.g., several months. The amount of charge loss, e.g., the decrease in Vth, is higher for the higher data states, in this example. The charge loss is also accelerated at a very high temperature such as 125 C.

FIG. 12B depicts an example Vth distribution of a set of data memory cells connected to a word line, before and after charge loss, when the adjacent dummy memory cells are programmed. The programming of the dummy memory cells occurs by injection disturb, as described herein. This programming, or increasing of the Vth, of the dummy memory cells can be controlled by adjusting the timing of word line and/or bit line voltages, as described further below. The Vth distributions 1210*a*, 1211*a*, 1212*a*, 1213*a*, 1214*a*, 1215*a*, 1216*a* and 1217*a* represent the erased state and the assigned data states A, B, C, D, E, F and G, respectively, with no charge loss. The Vth distributions 1210*b*, 1211*b*, 1212*b*, 1213*b*, 1214*b*, 1215*b*, 1216*b* and 1217*b* represent the erased state and the assigned data states A, B, C, D, E, F and G, respectively, with charge loss. The amount of charge loss is decreased compared to FIG. 12A.

FIG. 13A depicts a plot of the Vth of G state cells with and without charge loss, as a function of word line position. The vertical axis represents positive voltages. The word line position refers to the data word lines and extends from a source-side word line to a drain-side word line. For example, in FIG. 7, WLL0 is the source-side word line and WLL10 is the drain-side word line. In another example, there are 64 data word lines, where WL0 is the source-side word line and WL63 is the drain-side word line. The plot 1300 shows the case of a set of freshly programmed cells. The drain-side data memory cells are represented by the data point 1301. The offset between 1300 and 1301 is by design. The verify levels of WL63 are intentionally kept different than other word lines to avoid a high erase tail for WL63. Due to this, immediately after programming, WL63 would show a lower Vth for the G state compared to other word lines, and not because of charge loss. After bake, the charge loss for WL63 is higher compared to other word lines, as shown in FIG. 13B.

The plot 1310 shows the case of cells which have significant charge loss. The data of plot 1310 is achieved by exposing the cells freshly programmed cells to a bake for several hours at 125 C. This simulates 1-2 years of typical use of the memory device. The charge loss is significantly higher for the cells connected to the drain-side word line, as represented by the data point 1311 and the point 1321 of FIG. 13B.

The G state cells are the cells in the highest data state in this example and therefore experience the largest amount of charge loss.

FIG. 13B depicts a plot of a change in Vth due to charge loss in FIG. 13A, as a function of word line position. The vertical axis represents negative voltages from 0 to −0.5 V. The plot 1320 is obtained by subtracting the plot 1300 from the plot 1310 and therefore represents the Vth downshift due to charge loss. The data point 1321 represents the worst charge loss which is seen for the cells of the drain-side word line.

Figure 14:
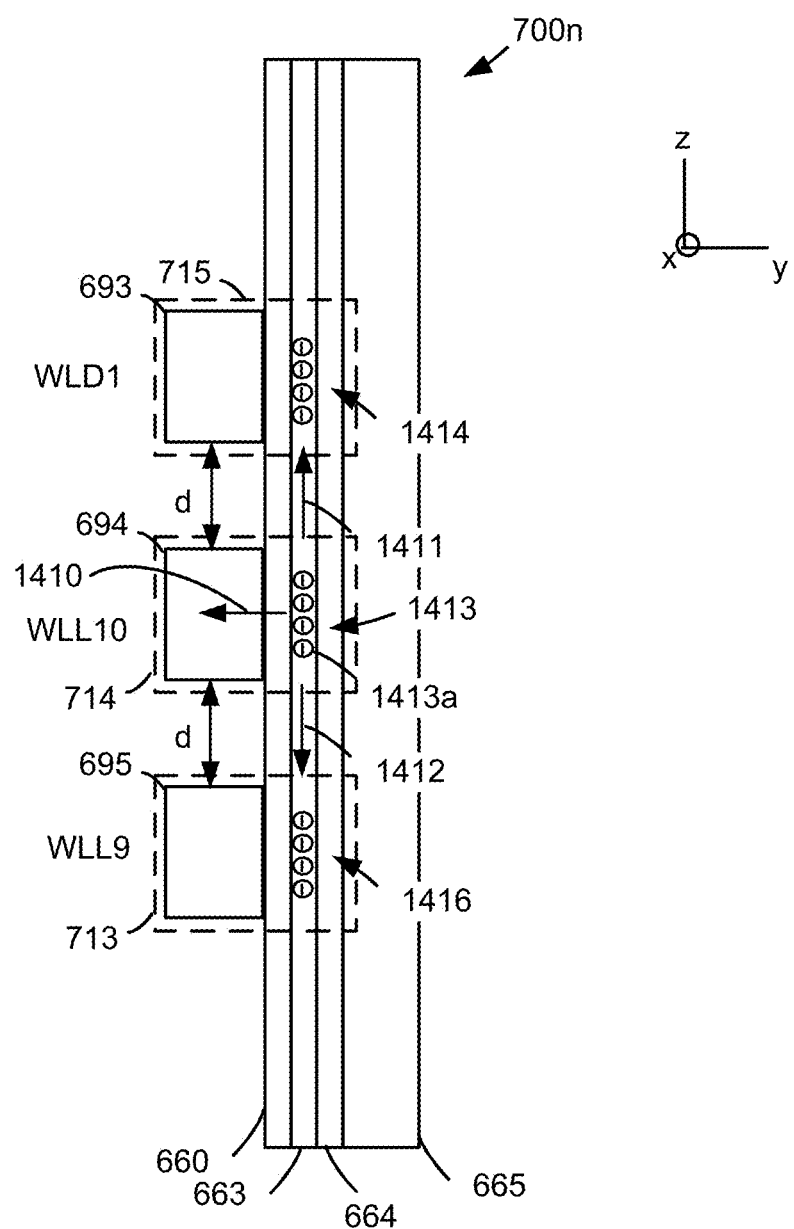
FIG. 14 depicts a drain end of the memory string 700n of memory cells of FIG. 7, showing lateral and vertical charge loss of a memory cell 714.

FIG. 14 depicts a drain end of the memory string 700*n* of memory cells of FIG. 7, showing lateral and vertical charge loss of a memory cell 714. As mentioned, the charge loss of a memory cell can have two components. One component is lateral charge loss which is due to the movement of charges (e.g., electrons) between cells in the direction of the length of the channel. This is the z direction in this example. Another component is vertical charge loss which is due to the movement of charges within a cell. This is the y direction in this example, which is perpendicular to the direction of the length of the channel. The cell 714 is connected to WLL10 which is the drain-side word line in this example. The adjacent dummy memory cell 715 on the drain side of the cell 714 is connected to WLD1, a dummy word line. The adjacent data memory cell 713 on the source side of the cell 714 is connected to WLL9, a data word line. The blocking oxide layer 660, charge-trapping layer 663, tunneling layer 664 and channel layer 665 of FIG. 6 are also provided.

A distance d separates the cell 714 from the adjacent cells. As memory devices become more scaled down, this distance will decrease so that the electric field between adjacent cells will increase. This in turn increases lateral charge loss. Example charges are depicted in the charge-trapping layer 663. For example, charges 1416, 1413 and 1414 are associated with cells 713, 714 and 715, respectively, which have control gates 695, 694 and 693, respectively. An electron 1413*a* is an example of the charges 1413. An arrow 1411 represents a lateral movement of some of the charges 1413 to a region of the charge-trapping layer associated with the cell 715 and the charges 1414. Similarly, an arrow 1412 represents a lateral movement of some of the charges 1413 to a region of the charge-trapping layer associated with the cell 713 and the charges 1416. An arrow 1410 represents a vertical movement of some of the charges 1413 to the control gate 694 through the blocking oxide layer 660.

Figure 15A:
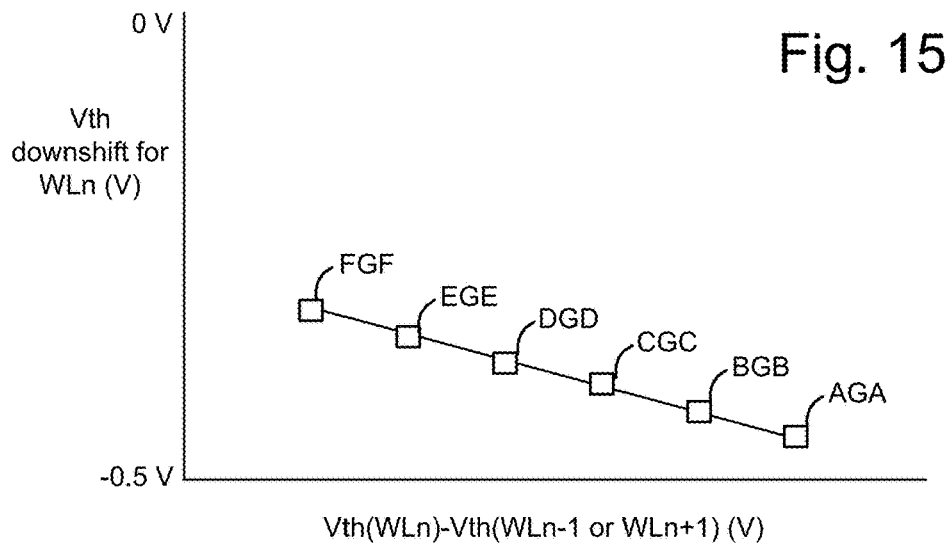
FIG. 15A depicts a plot showing lateral charge loss.

FIG. 15A depicts a plot showing lateral charge loss. The vertical axis depicts a Vth downshift for cells of a selected word line, WLn, and includes negative values from 0 to −0.5 V. The horizontal axis depicts Vth(WLn)−Vth(WLn−1 or WLn+1). This is the Vth of the WLn cells minus the Vth of the WLn−1 or WLn+1 cells. A WLn−1 cell is on the source side of and adjacent to a WLn cell, and a WLn+1 cell is on the drain side of and adjacent to the WLn cell. Further, the data points on the plot include a three letter sequence where the first, second and third letters represent the data state of the cells connected to WLn−1, WLn and WLn+1, respectively. Thus, the point labelled FGF indicates the Vth downshift for a G state cell adjacent to F state cells. In this case, the Vth difference between the F and G states is small so that the lateral charge loss is small. As the Vth difference between the WLn cell and the adjacent WLn−1 and WLn+1 cells become larger, the Vth downshift becomes greater. The point labelled AGA indicates the Vth downshift for a G state cell adjacent to A state cells. In this case, the Vth difference between the WLn cell and the adjacent WLn−1 and WLn+1 cells is largest so that the Vth downshift is greatest. The Vth downshift of a WLn cell due to lateral charge movement is proportional to the amount by which the Vth of the WLn cell exceeds the Vth of the WLn−1 and WLn+1 cells.

The points labelled EGE, DGD, CGC and BGB indicate the Vth downshift for a G state cell adjacent to E, D, C or B state cells, respectively.

Figure 15B:
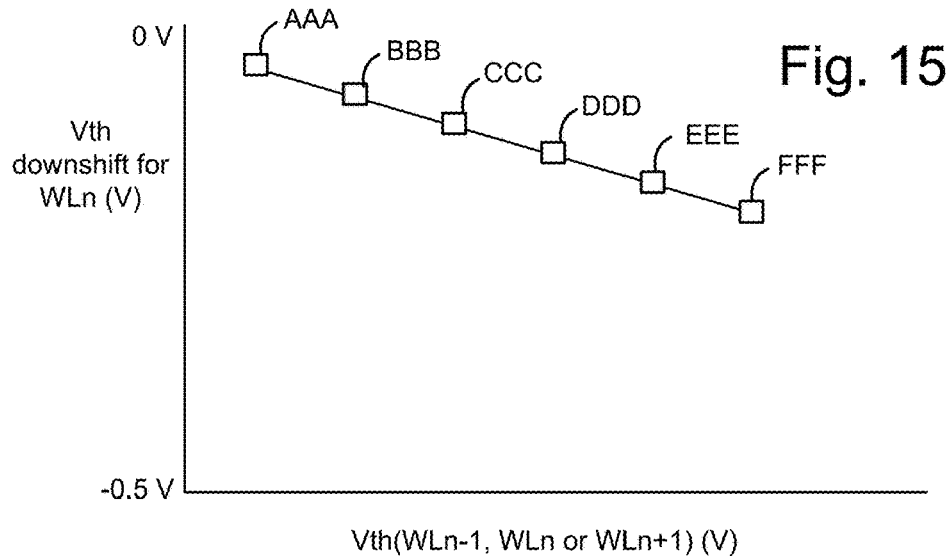
FIG. 15B depicts a plot showing vertical charge loss.

In FIGS. 15A and 15B, the Vth downshift on the vertical axis may represent the downshift of the lower tail of the Vth distribution at the two-sigma width of the distribution.

FIG. 15B depicts a plot showing vertical charge loss. The vertical axis depicts a Vth downshift for cells of a selected word line, WLn, and has the same scale as in FIG. 15A. The horizontal axis depicts Vth(WLn−1, WLn or WLn+1) and has the same scale as in FIG. 15A. This is the Vth of the WLn, WLn−1 or WLn+1 cells. The Vth is the same for each cell in this example for a given data point. As before, the data points on the plot include a three letter sequence where the first, second and third letters represent the data state of the cells connected to WLn−1, WLn and WLn+1, respectively. Thus, the point labelled AAA indicates the Vth downshift for an A state cell adjacent to A state cells. In this case, the Vth difference between the A states is zero, so there is no lateral charge loss. As a result, the Vth downshift is only due to vertical charge loss.

As the Vth level becomes larger, the Vth downshift becomes greater. The point labelled FFF indicates the Vth downshift for an F state cell adjacent to F state cells. In this case, the Vth level is largest so that the Vth downshift is greatest. The Vth downshift of a WLn cell due to vertical charge movement is proportional to the Vth level of the WLn cell.

The points labelled BBB, CCC, DDD and EEE indicate the Vth downshift for a B, C, D or E state cell adjacent to B, C, D or E state cells, respectively.

The lateral charge loss is significantly greater in magnitude than the vertical charge loss. Reducing lateral charge loss using the techniques described herein can therefore significantly reduce overall charge loss.

Figure 16A:
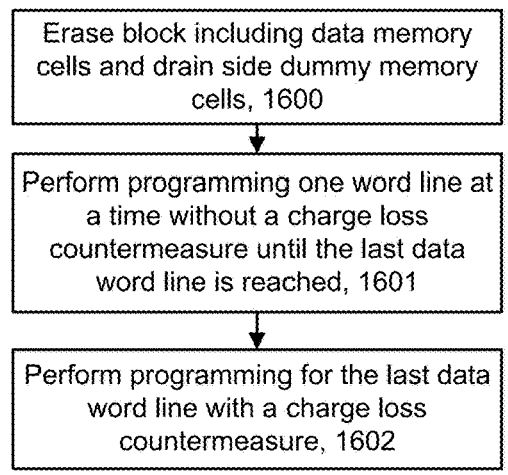
FIG. 16A depicts an overview of an example process for programming cells using a charge loss countermeasure.

FIG. 16A depicts an overview of an example process for programming cells using a charge loss countermeasure. Step 1600 includes erasing a block including data memory cells (e.g., cells 704-714, 724-734, 744-754 and 764-774 in FIG. 7) and drain side dummy memory cells (e.g., cells 715, 716, 735, 736, 755, 756, 775, 776 in FIG. 7). In one approach, the source side dummy memory cells remain in a programmed state. Step 1601 includes performing programming one word line at a time without a charge loss countermeasure until the last (drain-side) data word line is reached (e.g., WLL10 in FIG. 7). Step 1602 then includes performing programming for the last data word line with a charge loss countermeasure. The process of steps 1600-1602 may be repeated for each sub-block of a block. The charge loss countermeasure can involve increasing an injection disturb of the dummy memory cells by increasing the magnitude of a voltage gradient in the channel between the data memory cells and the dummy memory cells. The increased injection disturb, described further below, increases the Vth of the dummy memory cells so lateral charge loss is reduced. This is equivalent to moving to the left in the plot of FIG. 15A in the direction of smaller Vth downshift.

Figure 16B:
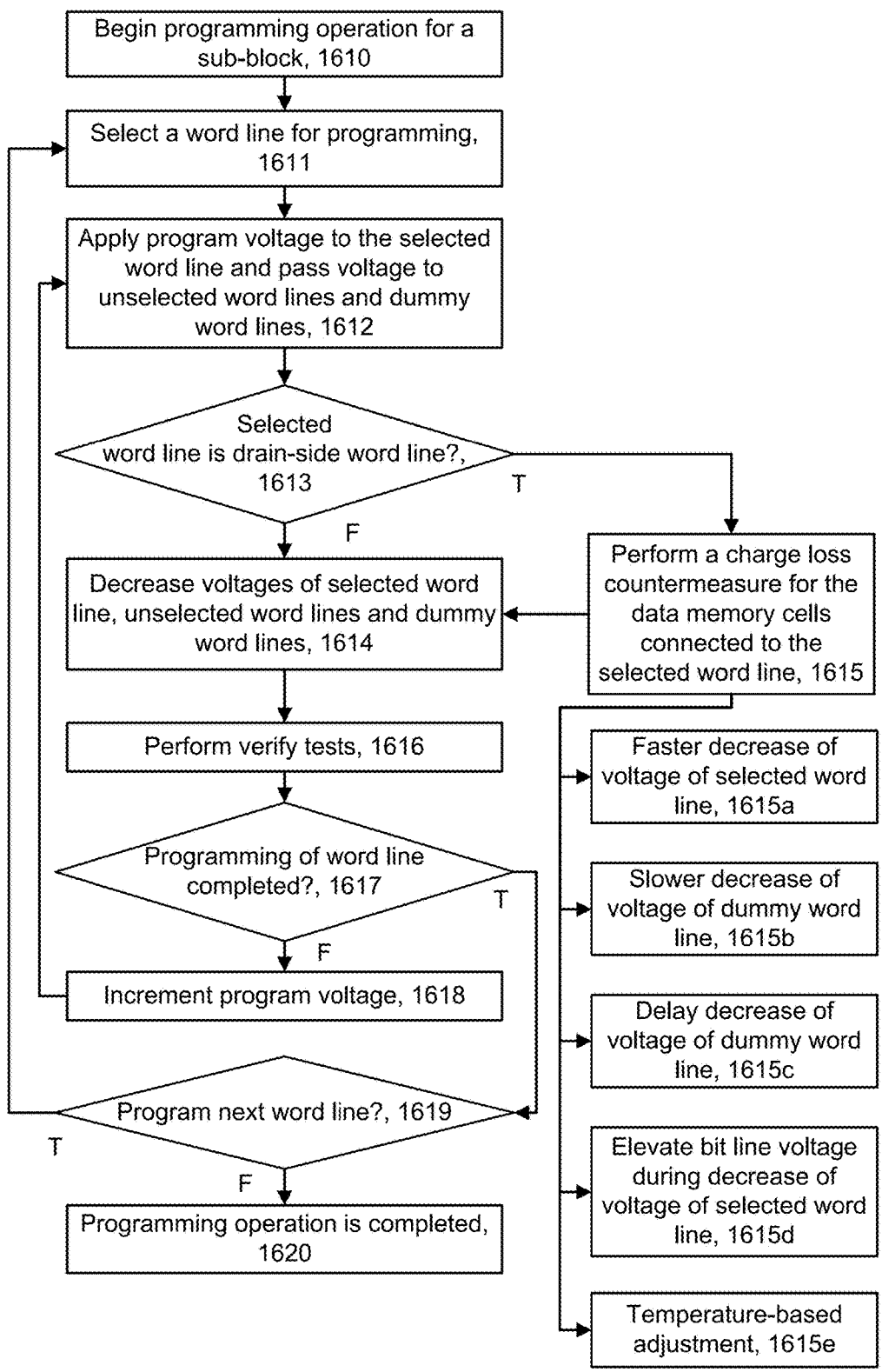
FIG. 16B depicts an example process for programming cells in a sub-block using a charge loss countermeasure, consistent with FIG. 16A.

FIG. 16B depicts an example process for programming cells in a sub-block using a charge loss countermeasure, consistent with FIG. 16A. Step 1610 begins a programming operation for a sub-block. Step 1611 selects a word line for programming. Step 1612 applies a program voltage to the selected word line and a pass voltage to unselected word lines and dummy word lines. A decision step 1613 determines if the selected word line is a drain-side word line, e.g., using the detection circuit 121 of FIG. 1A.

If the decision step 1613 is false, step 1614 decreases the voltages of the selected word line, the unselected word lines and the dummy word lines using nominal timing. This is a timing which is not designed to provide a charge loss countermeasure for the cells of the selected word line. Step 1616 involves performing verify tests. A decision step 1617 determines if programming of the selected word line is completed, e.g., whether the verify tests are passed. If decision step 1617 is true, a decision step 1619 determines if there is a next word line to program. If decision step 1619 is false, the programming operation is completed at step 1620. If decision step 1619 is true, a next word line is selected for programming at step 1611. If decision step 1617 is false, step 1618 increments the program voltage and step 1612 applies the next program voltage.

If decision step 1613 is true, step 1615 performs a charge loss countermeasure for the data memory cells connected to the selected word line. This can involve one or more of various possibilities. For example, step 1615a involves a faster decrease of the voltage of the selected word line. Step 1615b involves a slower decrease of the voltage of the dummy word line. Step 1615c involves delaying the decrease of the voltage of the dummy word line. Step 1615d involves elevating the bit line voltage during the decrease of the voltage of the selected word line. Step 1615e involves a temperature-based adjustment. The adjustments to the timing of the voltages of the selected word line and the dummy word line can be performed by the word line voltage timing circuit 117 of FIG. 1A. The temperature-based adjustment can involve using the temperature-sensing circuit 115 and the word line voltage timing circuit 117 and/or bit line voltage circuit 119 (FIG. 1A). Step 1614 can then implement the charge loss countermeasure such as by adjusting the timing of the decreases of the voltages of the selected word line, the unselected word lines and/or the dummy word lines. The charge loss countermeasure could also involve adjusting the bit line voltage during the decreases of the voltages of the selected word line, the unselected word lines and/or the dummy word lines.

Figure 16C:
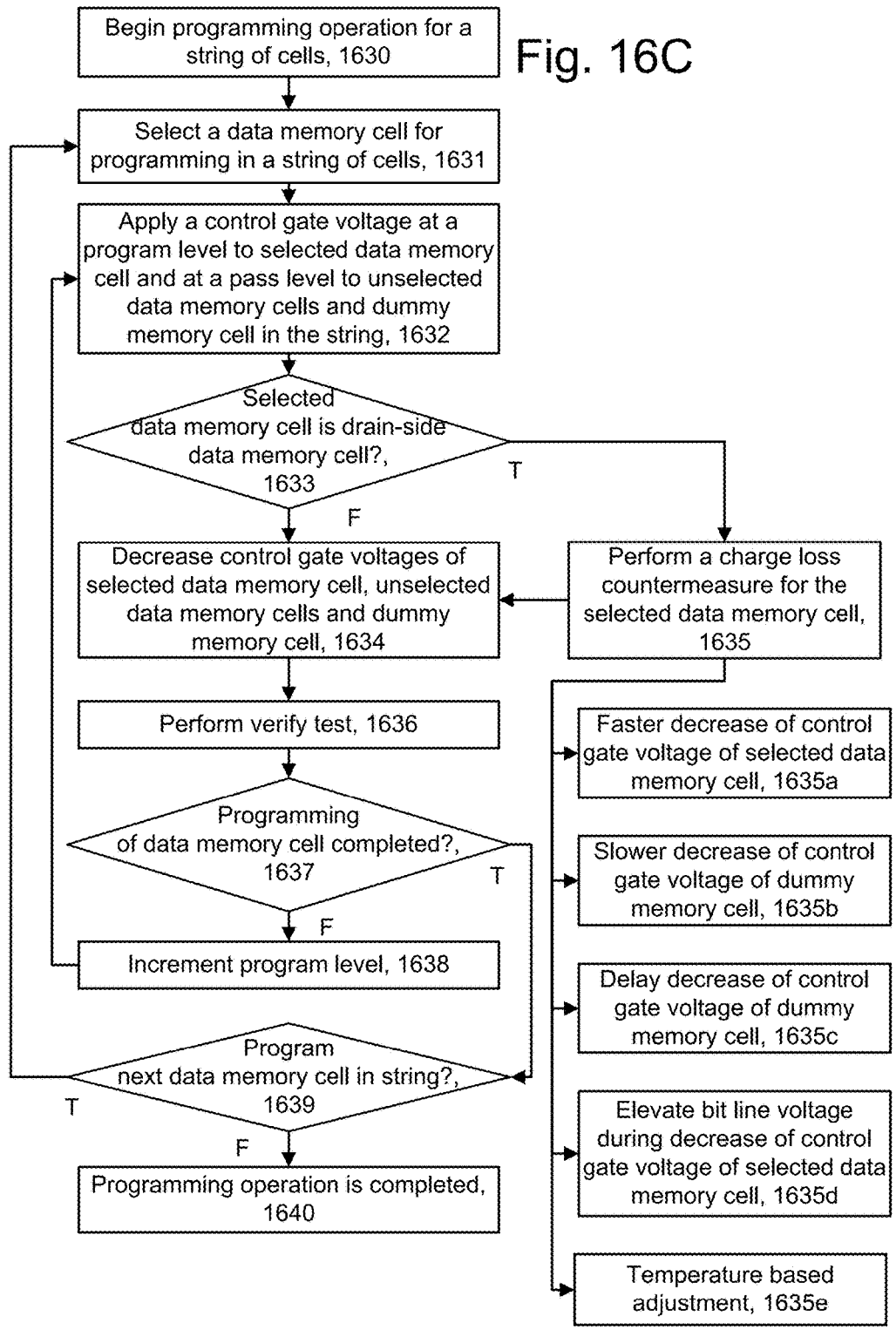
FIG. 16C depicts an example process for programming cells in a memory string using a charge loss countermeasure, consistent with FIGS. 16A and 16B.

FIG. 16C depicts an example process for programming cells in a memory string using a charge loss countermeasure, consistent with FIGS. 16A and 16B. Step 1630 begins a programming operation for a memory string of cells. This can be a set of series-connected memory cells, for instance.

One example is a NAND string. Step 1631 selects a data memory cell for programming. Step 1632 applies a control gate voltage at a program level (e.g., Vpgm) to the selected data memory cell and a control gate voltage at a pass level (e.g., Vpass) to unselected data memory cells and a dummy memory cell in the memory string. A decision step 1633 determines if the selected data memory cell is a drain-side data memory cell, e.g., using the detection circuit 121 of FIG. 1A.

If the decision step 1633 is false, step 1634 decreases the control gate voltages of the selected data memory cell, the unselected data memory cells and the dummy memory cell or cells using nominal timing. Step 1636 involves performing a verify test. A decision step 1637 determines if programming of the selected data memory cell is completed, e.g., whether the verify test is passed. If decision step 1637 is true, a decision step 1639 determines if there is a next data memory cell in the memory string to program. If decision step 1639 is false, the programming operation is completed at step 1640. If decision step 1639 is true, a next data memory cell is selected for programming at step 1631. If decision step 1637 is false, step 1638 increments the program level and step 1632 applies the next control gate voltage.

If decision step 1633 is true, step 1635 performs a charge loss countermeasure for the selected data memory cell. As used herein, a charge loss countermeasure is one or more operations, steps, procedures, or processes that introduce a bias or force on a dummy memory cell to counteract future lateral charge loss of an adjacent data memory cell. The charge loss countermeasure may increase the Vth of the dummy memory cell using a variety of techniques including injection disturb.

For example, step 1635a involves a faster decrease of the control gate voltage of the selected data memory cell. Step 1635b involves a slower decrease of the control gate voltage of the dummy memory cell. Step 1635c involves delaying the decrease of the control gate voltage of the dummy memory cell. Step 1635d involves elevating the bit line voltage during the decrease of the control gate voltage of the selected data memory cell. Step 1635e involves a temperature-based adjustment. Step 1634 can then implement the charge loss countermeasure such as by adjusting the timing of the decreases of the control gate voltages of the selected data memory cell, the unselected data memory cells and/or the dummy memory cells. The charge loss countermeasure could also involve adjusting the bit line voltage during the decreases of the control gate voltages of the selected data memory cell, the unselected data memory cells and/or the dummy memory cells.

FIG. 17A depicts an example of channel voltages associated with the memory cells 714 and 715 of FIGS. 7 and 14, and with the charge loss countermeasure of steps 1615-1615c or 1635-1635c of FIGS. 16B and 16C, respectively, where the memory cell 714 is being programmed to the G state and a nominal bit line voltage is used. For example Vbl_nom=0 V may be used. This is the bit line voltage when the program voltage is decreased from the program level. See FIG. 22C.

A portion of the memory string 700n and its channel 700a of FIG. 7 is depicted. The memory string 700n includes a data memory cell 714 connected to WLL10 and a dummy memory cell 715 connected to WLD1. Plots 1710a, 1710b and 1710c represent a voltage along the length of the channel. The channel regions 700b and 700c are adjacent to the data memory cell 714 and the dummy memory cell 715, respectively. The voltage (plot 1710a) in the channel region 700b occurs due to down coupling of the channel region when the selected word line voltage decreases from its program level (Vpgm) to a baseline level such as 0 V. The channel region 700b transitions from a conductive state to a non-conductive state when the selected word line voltage falls below the Vth of the cell 714. The amount of down coupling is thus greater when the cell has a higher Vth. For example, assume the selected word line voltage decreases from Vpgm=20 V to 0 V and that the cell has a Vth=6 V. The Vth may be just below a verify level VvG of 6.1 V, for example, so that the cell is still being programmed. The channel region 700b will cutoff when the selected word line voltage falls below 6 V. The subsequent transition from 6 V to 0 V will cause down coupling of the adjacent channel region 700b to about −6 V assuming a 1.0 (or 100%) coupling ratio. In practice, the coupling ratio may be 0.8-0.9, for instance.

Once the channel region 700b is cutoff, the voltage of the channel region 700c is a function of the dummy word line voltage minus the Vth of the dummy memory cell. A higher dummy word line voltage therefore results in the channel voltage (plot 1710c) being higher. The difference between the higher channel voltage of plot 1710c and the lower channel voltage of plot 1710a results in the channel gradient of plot 1710b between the channel regions 700b and 700c. Additionally, a higher dummy word line voltage more strongly attracts the electrons which are generated by the channel gradient into the charge trapping layer of the dummy memory cell to increase the injection disturb.

The channel gradient generates electron-hole pairs in the channel. The electrons can be accelerated and injected into the charge trapping layer of the dummy memory cell 715, causing a disturb. Example electrons are denoted by "−" in a circle and holes are denoted by "+". This disturb programs the dummy memory cell, thus increasing its Vth and tending to reduce any subsequent lateral charge loss by the data memory cell 714. The amount of disturb of the dummy memory cell is proportional to the Vth of the adjacent data memory cell. The techniques provided herein increase the amount of the disturb to more strongly increase the Vth of the dummy memory cell. This in turn more strongly reduces the lateral charge loss and improves data retention. The amount of disturb can be increased by increasing the channel gradient and/or the amount of time the channel gradient exists. The techniques provided herein can provide both approaches.

For example, as the program voltage is decreased, the dummy word line voltage is decreased from a pass level (Vpass) to a final level such as 0 V. The countermeasure can delay or slow the decrease of the dummy word line voltage so that the plot 1710c remains high for a longer period, compared to the case where the decrease of the dummy word line voltage is not delayed or slowed. Another option is to provide a faster decrease for the program voltage if the voltage driver circuitry provides this option.

During a program operation, as the program voltage is applied in successive program loops (see FIG. 10), the Vth of the cell 714 will increase progressively. The down coupling of the channel region 700b will therefore decrease progressively in the successive program loops. With the voltage of the channel region 700c at a constant level, the channel gradient and the disturb of the dummy memory cell 715 will increase progressively in the successive program loops of the program operation. The charge loss countermeasure can be applied in each program loop, in one approach.

For a selected cell 714 being programmed to a low state (e.g., A state), the amount of disturb of the dummy memory cell will be less than if the selected cell 714 is being programmed to a high state (e.g., G state). Once a cell completes programming, the channel voltage of the memory string is floated so that no further disturb of the dummy memory cell occurs.

FIG. 17B depicts an example of channel voltages associated with the memory cells 714 and 715 of FIGS. 7 and 14, and with the charge loss countermeasure of steps 1615-1615c or 1635-1635c of FIGS. 16B and 16C, respectively, where the memory cell 714 is being programmed to the A state and a nominal bit line voltage is used. Since the data memory cell 714 is in a lower state it will have a relatively lower Vth during a program operation and the amount of down coupling of the channel is less than in FIG. 17A. The plot 1720a represents the voltage of the channel region 700b of the data memory cell, while the plot 1720c represents the voltage of the channel region 700c of the dummy memory cell. Since the plot 1720a is higher (less negative) than the plot 1710a, the channel gradient, represented by the plot 1720b is smaller than in FIG. 17A. A weaker charge loss countermeasure is appropriate when the data memory cell is in a lower state and therefore less susceptible to lateral or vertical charge loss.

FIG. 17C depicts an example of channel voltages associated with the memory cells 714 and 715 of FIGS. 7 and 14, and with the charge loss countermeasure of steps 1615-1615d or 1635-1635d of FIGS. 16B and 16C, respectively, where the memory cell 714 is being programmed to the A state and an elevated bit line voltage is used. The bit line voltage can be elevated when the selected word line voltage is being decreased and a channel gradient is being generated which programs the dummy memory cell by injection disturb. The elevated bit line voltage can increase the voltage of the channel region 700c adjacent to the dummy memory cell (plot 1730c), thereby increasing the channel gradient (plot 1730b) compared to FIG. 17B. The voltage of the channel region 700b adjacent to the data memory cell (plot 1730a) is the same as in FIG. 17B, in this example. This technique enhances the disturb of the dummy memory cell to reduce lateral charge loss. See FIG. 22A-22C for an example. Vbl is typically at 0 V during a program voltage for a selected data memory cell in a selected memory string. The countermeasure involves increasing Vbl when the selected word line voltage is being decreased. In one approach, Vbl is at the elevated level when the channel gradient occurs, e.g., when the channel down coupling occurs in the channel region 700b. Vbl can remain at a lockout or program inhibit level for an unselected data memory cell in an unselected memory string.

Figure 18:
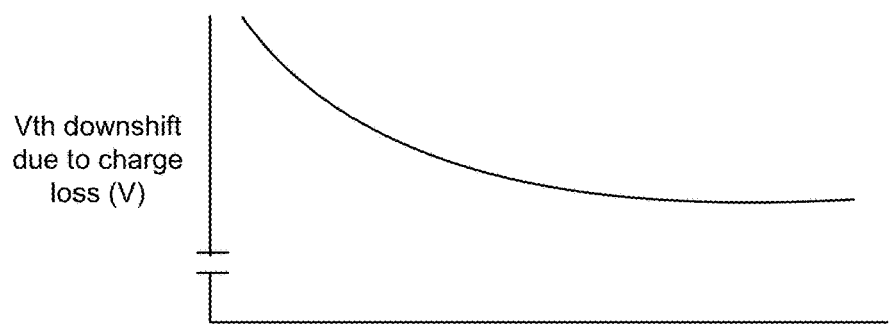
FIG. 18 depicts a plot showing a decrease in charge loss of data memory cells as the Vth of adjacent dummy memory cells increases.

FIG. 18 depicts a plot showing a decrease in charge loss of data memory cells as the Vth of adjacent dummy memory cells increases. The vertical axis depicts a Vth downshift of the drain-side data memory cells and the horizontal axis depicts the Vth of the adjacent dummy memory cell connected to WLD1. Other dummy memory cells which may be present, but not adjacent to the drain-side data memory cells, such as those connected to WLD2, tend to not affect the lateral charge loss of the drain-side data memory cells. This plot demonstrates that the Vth of the dummy memory cells should be increased to reduce charge loss of the data memory cells. In one approach, the Vth of the dummy memory cells should be increased to about 1.5-2 V. The Vth downshift is a representative value for cells of all of the data states.

Figure 19A:
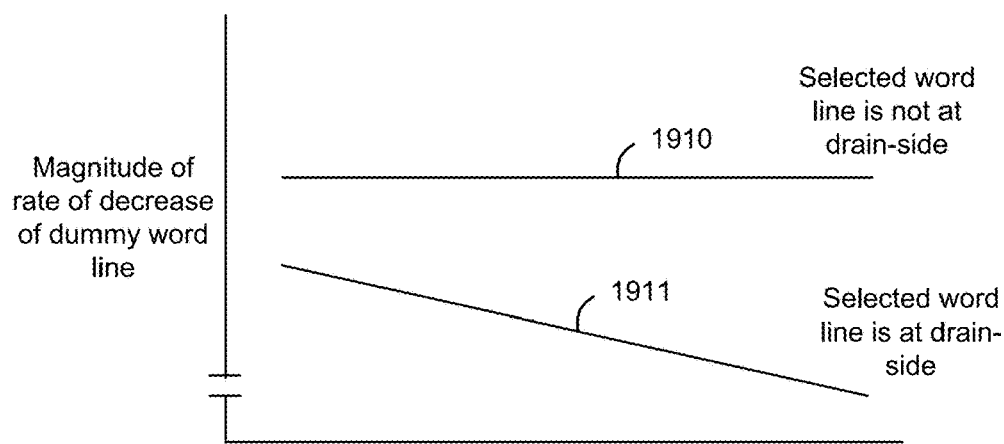
FIG. 19A depicts a plot showing a magnitude of a rate of decrease of a dummy word line voltage versus temperature, for the case of the selected word line not being at the drain-side of a memory string (plot 1910) and for the case of the selected word line being at the drain-side of a memory string (plot 1911).

FIG. 19A depicts a plot showing a magnitude of a rate of decrease of a dummy word line voltage versus temperature, for the case of the selected word line not being at the drain-side of a memory string (plot 1910) and for the case of the selected word line being at the drain-side of a memory string (plot 1911). As mentioned, the channel gradients of FIG. 17A-17C can be increased by adjusting the timing of the dummy word line voltage, e.g., by delaying the start of the decrease of the voltage (see FIG. 19C) or by reducing the magnitude of the rate of decrease of the voltage (e.g., increasing a time period in which the decrease occurs). The plot 1911 represents a lower rate of decrease (longer time of decrease) compared to the plot 1910. This adjustment can occur when the selected data memory cell being programmed is at the drain-side of a memory string. At other times, when the selected data memory cell is not at the drain-side of a memory string, the adjustment (charge loss countermeasure) is not used, in one approach. See also FIG. 22A. The longer time of decrease provides more time for the injection disturb of the dummy memory cells to occur.

Further, the adjustment of the timing of the dummy word line voltage can be a function of temperature. In particular, the injection disturb is stronger at lower temperatures so that the adjustment of the charge loss countermeasure can be less severe at lower temperatures. For example, the delay of the decrease in the voltage can be reduced at lower temperatures. Also, the rate of decrease of the voltage can be larger at lower temperatures. That is, the time period in which the decrease occurs in the dummy word line voltage can be smaller at lower temperatures compared to higher temperatures, while achieving the same amount of injection disturb. This has an advantage in that unnecessary delay or slowing of the dummy word line voltage can be avoided, where this delay or slowing could increase the overall program time.

Figure 19B:
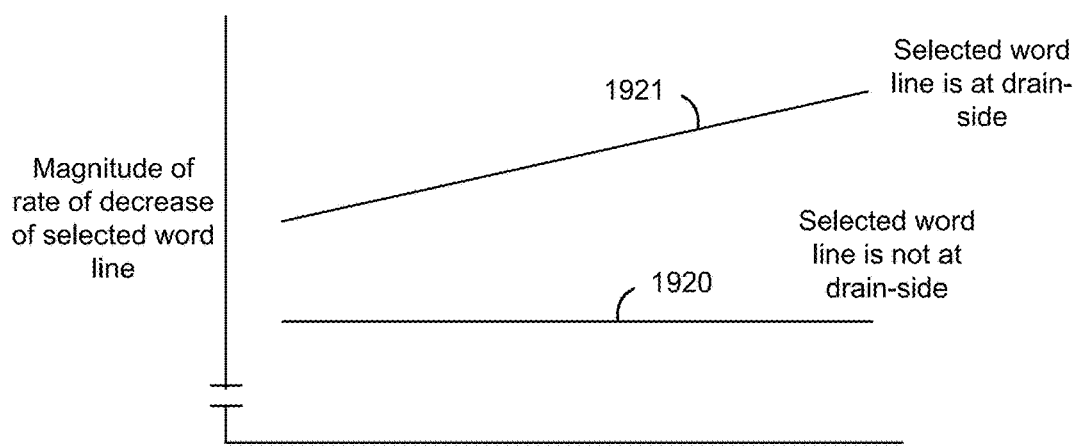
FIG. 19B depicts a plot showing a magnitude of a rate of decrease of a selected word line voltage versus temperature, for the case of the selected word line not being at the drain-side of a memory string (plot 1920) and for the case of the selected word line being at the drain-side of a memory string (plot 1921).

FIG. 19B depicts a plot showing a magnitude of a rate of decrease of a selected word line voltage versus temperature, for the case of the selected word line not being at the drain-side of a memory string (plot 1920) and for the case of the selected word line being at the drain-side of a memory string (plot 1921). As mentioned, the channel gradients of FIG. 17A-17C can be increased by adjusting the timing of the drain-side data word line voltage, e.g., by increasing the magnitude of the rate of decrease of the voltage (e.g., decreasing a time period in which the decrease occurs). The plot 1921 represents a larger rate of decrease (shorter time of decrease) compared to the plot 1920. Further, the adjustment of the timing of the selected word line voltage can be a function of temperature. For example, the magnitude of the rate of decrease of the voltage can be lower at lower temperatures. That is, the time period in which the decrease occurs in the selected word line voltage can be larger at lower temperatures compared to higher temperatures, while achieving the same amount of injection disturb. See also FIG. 22A.

FIG. 19C depicts a plot showing a delay in the decrease of a dummy word line voltage versus temperature, for the case of the selected word line not being at the drain-side of a memory string (plot 1930) and for the case of the selected word line being at the drain-side of a memory string (plot 1931). As mentioned, the channel gradients of FIG. 17A-17C can be increased by delaying the start of the decrease of the dummy word line voltage. The plot 1931 represents a non-zero delay compared to the plot 1930, which represents no delay. This adjustment can occur when the selected data memory cell being programmed is at the drain-side of a memory string. At other times, when the selected data memory cell is not at the drain-side of a memory string, the delay and the charge loss countermeasure are not used, in one approach. See also FIG. 22C.

FIG. 20A depicts a plot of a step change in a requested voltage (Vreq.) of a selected word line. In FIGS. 20A and 20B, the vertical axis depicts a requested voltage (Vreq.) and the horizontal axis depicts time. The circuitry which is used to control the selected word line (e.g., the power control circuit 116 of FIG. 1A or voltage sources 2520 of FIG. 25) may operate in response to a request to provide a certain voltage output. The circuit will respond by providing the requested output. Due to factors such as the capacity of the circuit and the RC time constant of the word line, there is some finite time needed for the requested output to be reached. The plot shows that Vpgm is applied as a program voltage, e.g., as shown in FIG. 10. At a specified time tx, the requested output changes in a step change to 0 V. For example, the circuit may operate on clock cycles where Vpgm is requested at one clock cycle and 0 V is requested at the next clock cycle. The example waveforms for the selected word line in FIG. 22A are consistent with such a step change in the requested voltage.

FIG. 20B depicts a plot of a requested voltage (Vreq.) of a dummy word line, for the case of a step change (plot 2010) and for the case of a ramp change (plot 2011). The plot 2010 shows the case of a step change in the requested voltage of the dummy word line, similar to the step change of FIG. 20A. The plot 2011 shows a ramp change in the requested voltage. In this case, the circuit may operate on clock cycles where Vpass is requested at one clock cycle, progressively lower voltages are requested in subsequent clock cycles and finally 0 V is requested at a last clock cycle. The waveforms for the dummy word line in FIG. 22A provide examples of a step change and a ramp change in the requested voltage. The ramp may represent a controlled gradual decrease in the voltage. The delay between the requested voltage and the actual output voltage will be smaller than for a step change because the change occurs over a longer period of time. The plot 2011 has a staircase shape in which the horizontal portions have a duration of a time increment of dt and the vertical portions have a magnitude of a voltage increment of dVreq. In one approach, dt represents one or more clock cycles. dVreq. could represent the smallest granular change in Vreq. which is provided by the control system for the circuit. Or, dVreq. could represent a multiple of the smallest granular change. The staircase shape extends over a time period tx-ty.

FIG. 20C depicts a plot of a bit line voltage as a function of a data state of a selected cell, for use as a charge loss countermeasure, consistent with steps 1602, 1615 and 1635 of FIGS. 16A, 16B and 16C, respectively. The vertical axis depicts bit line voltage (Vbl) and the horizontal axis depicts the data state of a selected drain-side memory cell. Vbl_nom is a nominal bit line voltage which is applied when no charge loss countermeasure is used. Vbl_nom=0 V, for example. Vbl_min and Vbl_max are the lowest and highest bit line voltages, respectively, as depicted by plot 2020. Plot 2020 applies for relatively higher temperatures. The lower plot, plot 2021, applies for relatively lower temperatures. As mentioned, when an elevated Vbl (higher than Vbl_nom) is used as a charge loss countermeasure, it can be lower at lower temperatures because the injection disturb is greater.

The bit line voltage can be a function of the assigned data state of a selected cell, to adaptively adjust the voltage gradient and the amount of injection disturb in the channel to the assigned data state. This approach results in less injection disturb when the selected cell has a low assigned data state and more injection disturb when the selected cell has a high assigned data state.

FIG. 21A depicts example Vth distributions of A, D and G state cells of a selected word line and of dummy memory cells of an adjacent dummy word line, where a charge loss countermeasure is not used so that the dummy memory cells are not significantly programmed. The Vth distributions 910, 920, 926 and 932 for the Er, A, D and G states are repeated from FIG. 9. The Vth distributions of the other states are omitted to allow the Vth distributions of the dummy memory cells to be seen more clearly. A small amount of injection disturb may occur even without the charge loss countermeasures described herein. The injection disturb results in a weak programming of the dummy memory cells adjacent to the drain-side memory cells. Moreover, the amount of programming is proportional to the Vth of the adjacent drain-side memory cell. For example, the Vth distribution 920a represents a very small amount of programming which occurs when the adjacent drain-side memory cell is programmed to the A state, the lowest programmed state. The Vth distribution 926a represents a somewhat larger amount of programming which occurs when the adjacent drain-side memory cell is programmed to the D state, a mid-range programmed state. The Vth distribution 932a represents a larger amount of programming which occurs when the adjacent drain-side memory cell is programmed to the G state, the highest programmed state in this example.

FIG. 21B depicts example Vth distributions of A, D and G state cells of a selected word line and of dummy memory cells of an adjacent dummy word line, where a charge loss countermeasure is used so that the dummy memory cells are significantly programmed. A significant amount of injection disturb is generated with the charge loss countermeasures described herein. The injection disturb results in a significant programming of the dummy memory cells adjacent to the drain-side memory cells. As in FIG. 21A, the amount of programming is proportional to the Vth of the adjacent drain-side memory cell. The Vth distributions 920b, 926b and 932b represents programming which occurs when the adjacent drain-side memory cell is programmed to the A, D or G state, respectively. The higher Vth levels of the dummy memory cells in FIG. 21B versus FIG. 21A result in reduced lateral charge loss for the drain-side data memory cell.

FIG. 22A depicts example waveforms of word lines in a programming operation. In FIG. 22A-22C, the vertical axis depicts voltage and the horizontal axis depicts time. This is an example of a programming operation which includes a pre-charge phase, a program phase and a verify phase in a program loop such as in FIG. 10. The pre-charge phase is from t0-t2. In this phase, the SGD transistor of a memory string is made conductive to allow a bit line voltage to charge the channels of the memory strings (selected and unselected). The unselected memory strings are further charged up in the program phase, which is from t2-t6. In this phase, a program voltage is applied to a selected word line. The program voltage may be ramped up from 0 V to Vpass and then from Vpass to Vpgm. A voltage decrease phase is from t6-t13. In this phase, the selected word line voltage and the dummy word line voltage decrease, e.g., from a programming level (Vpgm) to 0 V and from a pass level (Vpass) to 0 V, respectively. The charge loss countermeasure occurs in the voltage decrease phase. The verify phase or test is from t14-17 after a small delay from t13-t14 which ensures that the word line voltages have returned to 0 V or other steady state level. In this phase, one or more verify voltages are applied to the selected word line. The verify voltage may be ramped up from 0 V to VvA and then from VvA to VvB.

In this example, the verify phase does not include VvC because it occurs early in the programming operation. The verify voltage is consistent with waveform 1010 of FIG. 10.

A plot 2200 indicates that the selected data word line, the unselected data word lines and the dummy word lines WLD1 and WLD2 are initially at 0 V, for example. A plot 2201 represents a ramp up in the voltage of the word lines. The voltage stabilizes at Vpass from t3-t4. For the selected word line, the plot 2202 depicts an increase from Vpass to Vpgm. The voltage stabilizes at a peak level of Vpgm from t5-t6 (plot 2203). The plot 2204 shows that the remaining word lines are kept at Vpass. The end of the program voltage is at t6. At this time, the program voltage has been applied at Vpgm for the desired amount of time and begins to decrease back to a nominal, steady state level such as 0 V. Two options are depicted for the decrease of the selected word line voltage. Plot 2206 depicts a nominal rate of decrease and plot 2205 depicts a relatively high rate of decrease which can be used as a charge loss countermeasure, as discussed.

For the other word lines, the plot 2207 represents a nominal rate of decrease with no delay relative to the start of the decrease of the selected word line voltage at t6. The plot 2208 represents a relatively low rate of decrease, e.g., a staircase or ramp decrease (as in FIG. 20B), which can be used as a charge loss countermeasure, as discussed. The plot 2209 represents a nominal rate of decrease with a delay of t7-t6 relative to the start of the decrease of the selected word line voltage at t6. The plot 2210 represents a relatively low rate of decrease with a delay of t7-t6 relative to the start of the decrease of the selected word line voltage at t6. The delay is a delay of the start of the decrease of the dummy word line voltage relative to a start of the decrease of the selected word line voltage, in one approach.

The plots 2205 and 2206 decrease over a time period of t6-t9 and t6-t10, respectively. The plots 2207 and 2208 decrease over a time period of t6-t8 and t6-t12, respectively. The plots 2209 and 2210 decrease over a time period of t7-t11 and t7-t13, respectively.

The selected word line voltage increases from 0 V to VvA (plot 2211) at t14 and then from VvA to VvB (plot 2212). Corresponding sensing operations occur at t15 and t16. The remaining word lines may be kept at 0 V (plot 2213) during the sensing operations.

A program voltage waveform includes plots 2200-2203 and 2205 or 2206. The program voltage waveform comprises an increasing portion (plot 2201, 2202), a peak portion (plot 2203) and a decreasing portion (plot 2205 or 2206). A pass voltage waveform includes plots 2200, 2201, 2204 and one of 2207-2210. The pass voltage waveform comprises an increasing portion (plot 2201), a peak portion (plot 2204) and a decreasing portion (plots 2207-2210).

FIG. 22B depict example waveforms for SGD transistors in a programming operation, consistent with FIG. 22A. The waveform represent the control gate voltage on the SGD line, e.g., SGD1 and SGD0. The SGD transistors are made conductive during the pre-charge phase. Plot 2220 depicts increasing the voltage from 0 V to a peak level such as 3-4 V at t0. Plot 2221 depicts keeping the voltage at the peak level until t1 so that the SGD transistors are in a conductive state and pass a pre-charge voltage from the bit line to the channel of each memory string (selected and unselected).

In a selected sub-block, Vsgd is reduced slightly from its peak level (plot 2222) and remains at an elevated level such as 2 V (plot 2223) until the end of the programming operation when Vsgd decreases to 0 V (plot 2224). This allows the SGD transistors of the selected memory strings to be made conductive when the memory strings are selected for programming in the current program loop, by setting the corresponding Vbl to a low value such as 0 V, or non-conductive when the memory string is not selected for programming in the current program loop, by setting the corresponding Vbl to a high value such as 2-2.5 V. Note that the Vsgd values are for a selected sub-block in which programming occurs. For unselected sub-block, Vsgd can remain at 0 V to cutoff the associated memory strings from the bit lines.

FIG. 22C depicts example waveforms for bit lines in a programming operation, consistent with FIG. 22A. Plot 2230 shows that Vbl increases from 0 V to 2 V, for example, starting at t0. Plot 2231 shows that Vbl is kept at 2 V to provide the channel pre-charge. Plot 2232 shows that Vbl decreases from 2 V to 0 V starting at t1 for memory strings which are selected for programming in the current program loop and remains at 0 V during the programming phase as depicted by plot 2233. Plot 2234 shows that Vbl remains at an elevated level during the programming phase for memory strings which are not selected for programming in the current program loop. Plot 2235 shows Vbl decreasing to 0 V for the unselected memory strings.

During the programming phase, the SGD transistor of a selected string (which is in a selected sub-block) will have a high Vsgd as depicted by plot 2223 and a low Vbl as depicted by plot 2233. This provides a high gate-to-drain voltage which makes the SGD transistor conductive. The SGD transistor of an unselected string in a selected sub-block will have a high Vsgd as depicted by plot 2223 (since the Vsgd is common to all strings in a sub-block, in one example) and a high Vbl as depicted by plot 2234. This provides a gate-to-drain voltage which makes the SGD transistor non-conductive. The SGD transistor of (unselected) strings in the unselected sub-blocks will have Vsgd=0 V and a low Vbl as depicted by plot 2233. This provides a gate-to-drain voltage which makes the SGD transistor non-conductive.

During the voltage decrease phase, Vbl may be elevated as a charge loss countermeasure or kept at 0 V if Vbl is not used as a charge loss countermeasure. Plot 2236 shows Vbl increasing from 0 V to 1-2 V, for instance, for the selected memory strings, and remaining at this elevated level until t12, when it returns to 0 V. Vbl for the selected memory strings may be at the elevated level during the decrease in the selected word line voltage, for example, to provide a charge loss countermeasure as discussed (FIG. 71C). Vbl for the unselected memory strings may remain at 0 V in the voltage decrease phase.

After the programming phase, Vbl is set at a level which allows sensing to occur, e.g., 1-2 V, as depicted by plot 2237, for selected memory strings, and at a level which does not allow sensing to occur, e.g., 0 V, as depicted by plot 2238, for unselected memory strings. After the sensing occurs, Vbl is decreased to 0 V at t17.

Figure 23:
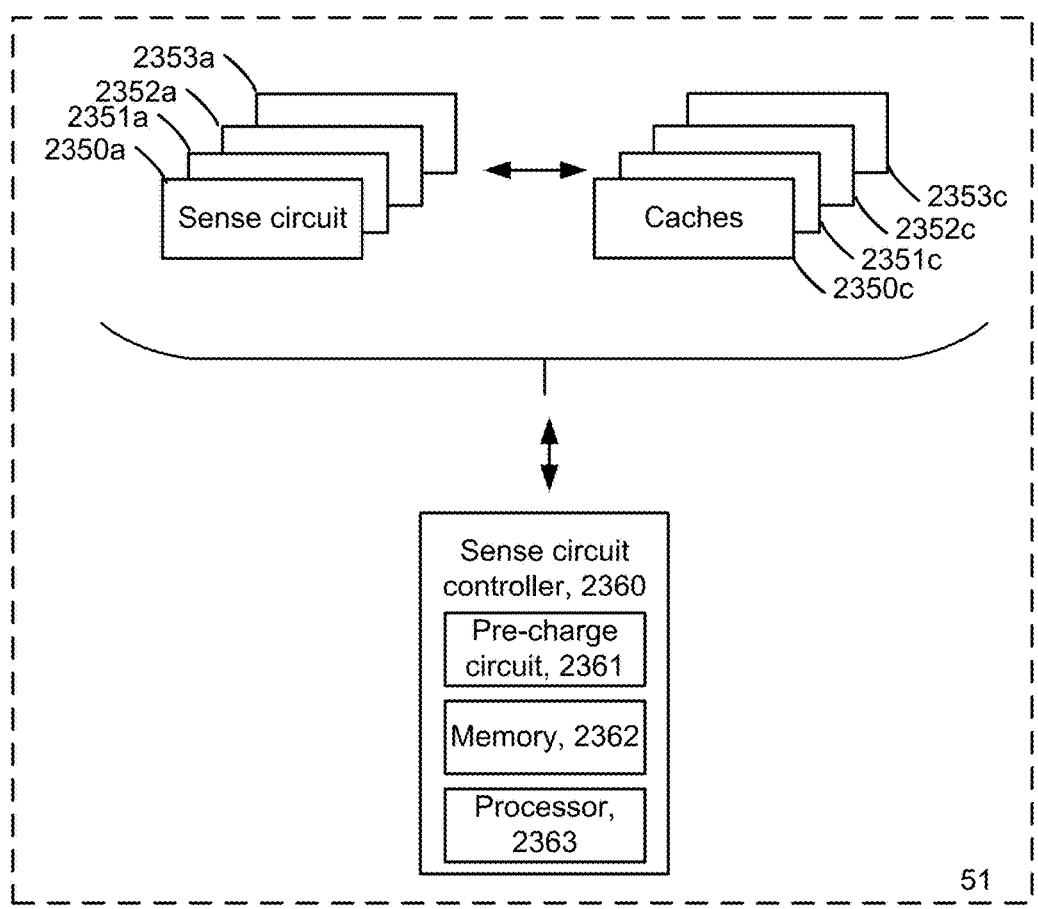
FIG. 23 depicts an example block diagram of a sense block 51 in the column control circuitry of FIG. 1A.

FIG. 23 depicts an example block diagram of a sense block 51 in the column control circuitry of FIG. 1A. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 2350a, 2351a, 2352a and 2353a are associated with caches 2350c, 2351c, 2352c and 2353c, respectively.

In one approach, different subsets of bit lines can be sensed using different respective sense blocks. This allows the processing load which is associated with the sense circuits to be divided up and handled by a respective processor in each sense block. For example, a sense circuit controller 2360 can communicate with the set, e.g., sixteen, of sense circuits and latches. The sense circuit controller may include a pre-charge circuit 2361 which provides a voltage to each sense circuit for setting a pre-charge voltage. The sense circuit controller may also include a memory 2362 and a processor 2363.

Further example details of the sense circuit controller and the sense circuits are provided below.

Figure 24:
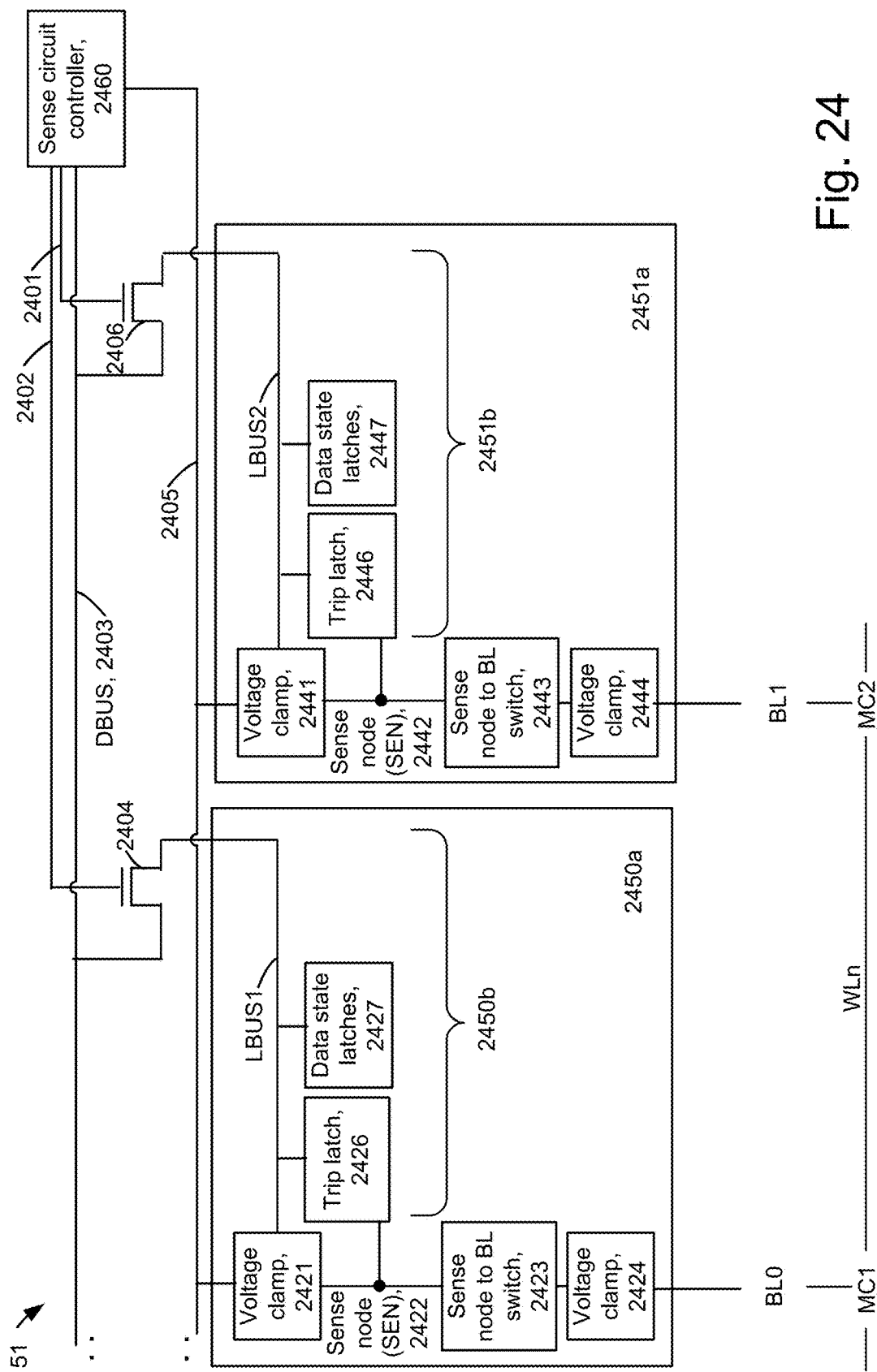
FIG. 24 depicts another example block diagram of a sense block 51 in the column control circuitry of FIG. 1A.

FIG. 24 depicts another example block diagram of a sense block 51 in the column control circuitry of FIG. 1A. The sense circuit controller 2460 communicates with multiple sense circuits including example sense circuits 2450a and 2451a. The sense circuit 2450a includes latches 2450b, including a trip latch 2426 and data state latches 2427. During a program operation, the data state latches may store the data which identifies the assigned data state of cells MC1 and MC2, which are connected to the bit lines BL0 and BL1, respectively. In case of a failure in programming data to cells of a word line, this data can be read and stored in another block, as discussed.

The sense circuit further includes a voltage clamp 2421 such as a transistor which sets a pre-charge voltage at a sense node 2422 (SEN). A sense node-to-bit line (BL) switch 2423 selectively allows the sense node to communicate with a bit line BL0, e.g., the sense node is electrically connected to the bit line so that the sense node voltage can decay. BL0 is connected to one or more memory cells, such as a memory cell MC1. A voltage clamp 2424 can set a voltage on the bit line, such as during a sensing operation or during a program voltage. A local bus, LBUS1, allows the sense circuit controller to communicate with components in the sense circuit, such as the latches 2450b and the voltage clamp in some cases. To communicate with the sense circuit 2450a, the sense circuit controller provides a voltage via a line 2402 to a transistor 2404 to connect LBUS1 with a data bus DBUS, 2403. The communicating can include sending data to the sense circuit and/or receive data from the sense circuit.

The sense circuit controller can communicate with different sense circuits in a time-multiplexed manner, for instance. A line 2405 may be connected to the voltage clamp in each sense circuit, in one approach.

The sense circuit 2451a includes latches 2451b, including a trip latch 2446 and data state latches 2447. A voltage clamp 2441 may be used to set a pre-charge voltage at a sense node 2442 (SEN). A sense node-to-bit line (BL) switch 2443 selectively allows the sense node to communicate with a bit line BL1, and a voltage clamp 2444 can set a voltage on the bit line. BL1 is connected to one or more memory cells such as a memory cell MC2. A local bus, LBUS2, allows the sense circuit controller to communicate with components in the sense circuit, such as the latches 2451b and the voltage clamp in some cases. To communicate with the sense circuit 2451a, the sense circuit controller provides a voltage via a line 2401 to a transistor 2406 to connect LBUS2 with DBUS. The lines 2401 and 2402 can be considered to be sense amplifier control lines.

The example memory cells MC1 and MC2 are connected to a selected word line WLn.

During an erase operation, the trip latches may store data which results from the erase verify test of the respective string of memory cells.

Figure 25:
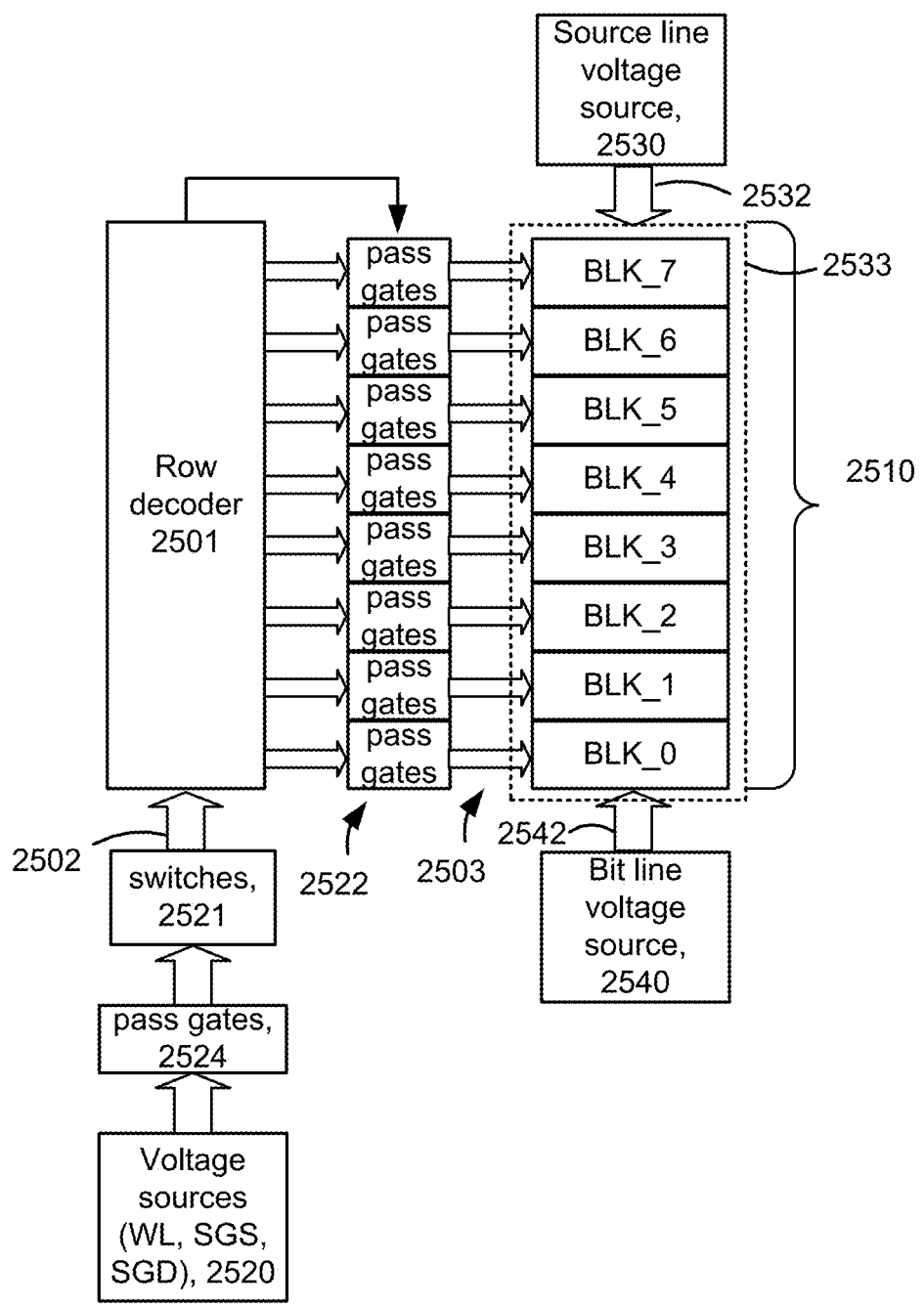
FIG. 25 depicts an example circuit for providing voltages to blocks of memory cells.

FIG. 25 depicts an example circuit for providing voltages to blocks of memory cells. In this example, a row decoder 2501 provides voltages to word lines and select gates of each block in set of blocks 2510. The set could be in a plane and includes blocks BLK_0 to BLK_7. The row decoder provides a control signal to pass gates 2522 which connect the blocks to the row decoder. Typically, operations, e.g., program, read or erase, are performed on one selected block at a time. The row decoder can connect global control lines 2502 to local control lines 2503. The control lines represent conductive paths. Voltages are provided on the global control lines from voltage sources 2520. The voltage sources may provide voltages to switches 2521 which connect to the global control lines. Pass gates 2524, also referred to as pass transistors or transfer transistors, are controlled to pass voltages from the voltage sources 2520 to the switches 2521.

The voltage sources 2520 can provided voltages on word lines (WL), SGS control gates and SGD control gates, for example.

The various components, including the row decoder, may receive commands from a controller such as the state machine 112 or the controller 122 to perform the functions described herein.

A source line voltage source 2530 provides the erase voltage to the source lines/diffusion region in the substrate via control lines 2532. In one approach, the source diffusion region 2533 is common to the blocks. A set of bit lines 2542 is also shared by the blocks. A bit line voltage source 2540 provides voltages to the bit lines. In one possible implementation, the voltage sources 2520 are near the bit line voltage source.

In one implementation, an apparatus comprises: a set of series-connected memory cells comprising a data memory cell and a dummy memory cell; a power control circuit configured to concurrently apply a control gate voltage to the data memory cell at a programming level and a control gate voltage to the dummy memory cell at a pass level, to decrease the control gate voltage of the data memory cell from the programming level and to decrease the control gate voltage of the dummy memory cell from the pass level; a detection circuit configured to detect whether the data memory cell is adjacent to the dummy memory cell; and a timing circuit configured to control the power control circuit to perform a charge loss countermeasure for the data memory cell in response to the detection circuit detecting that the data memory cell is adjacent to the dummy memory cell.

In another implementation, a method comprises: in connection with a programming operation for a data memory cell in a set of series-connected memory cells, applying a program voltage waveform to the data memory cell and a pass voltage waveform to a dummy memory cell in the set of series-connected memory cells, the program voltage waveform comprising an increasing portion, a peak portion and a decreasing portion, and the pass voltage waveform comprising an increasing portion, a peak portion and a decreasing portion; and adjusting a timing of the decreasing portion of the program voltage waveform relative to a timing of the decreasing portion of the pass voltage waveform as a function of a position of the data memory cell in the set of series-connected memory cells.

In another implementation, an apparatus comprises: means for applying a program voltage waveform to a data memory cell, the program voltage waveform comprising an increasing portion, a peak portion and a decreasing portion; and means for controlling an amount of injection disturb of a dummy memory cell adjacent to the data memory cell during the decreasing portion of the program voltage waveform.

The means described above can include the components of the memory device 100 of FIG. 1A, 1B and FIG. 2, for example, such as the control circuitry 110 and controller 122. Moreover, the means described above can include the components of FIG. 23-25, including the decoders, voltage drivers, switches and pass transistors.

In various embodiments, the means for applying a program voltage waveform to a data memory cell may include the power control circuit 116 and the row decoder 124 of FIG. 1A, and the voltage sources 2520, pass gates 2524, switches 2521, row decoder 2501 and pass gates 2522 of FIG. 25, or other logic hardware, and/or other executable code stored on a computer readable storage medium. Other embodiments may include similar or equivalent means for applying a program voltage waveform.

The means for controlling an amount of injection disturb of a dummy memory cell may include means which control a rate of decrease or duration of decrease of a voltage of the dummy memory cell and/or a rate of decrease or duration of decrease of the program voltage waveform. This means can include the power control circuit 116, the word line voltage timing circuit 117, and the row decoder 124 of FIG. 1A, and the voltage sources 2520, pass gates 2524, switches 2521, row decoder 2501 and pass gates 2522 of FIG. 25, or other logic hardware, and/or other executable code stored on a computer readable storage medium. Other embodiments may include similar or equivalent means for applying a program voltage waveform.

The means for controlling an amount of injection disturb of a dummy memory cell may also include means for controlling a voltage of a bit line connected to the dummy memory cell during the decreasing portion of the program voltage waveform. This means can include the power control circuit 116, the bit line voltage circuit 119 and the column decoder 132 of FIG. 1A, and the bit line voltage source 2540 of FIG. 25, or other logic hardware, and/or other executable code stored on a computer readable storage medium. Other embodiments may include similar or equivalent means for applying a program voltage waveform.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a set of series-connected memory cells comprising a data memory cell and a dummy memory cell;
a power control circuit configured to concurrently apply a control gate voltage to the data memory cell at a programming level and a control gate voltage to the dummy memory cell at a pass level, to decrease the control gate voltage of the data memory cell from the programming level and to decrease the control gate voltage of the dummy memory cell from the pass level;
a detection circuit configured to detect whether the data memory cell is adjacent to the dummy memory cell; and
a timing circuit configured to control the power control circuit to perform a charge loss countermeasure for the data memory cell in response to the detection circuit detecting that the data memory cell is adjacent to the dummy memory cell.

2. The apparatus of claim 1, wherein:
the charge loss countermeasure for the data memory cell increases a threshold voltage of the dummy memory cell.

3. The apparatus of claim 1, wherein:
the timing circuit, to perform the charge loss countermeasure for the data memory cell, is configured to provide a voltage gradient in a channel between the data memory cell and the dummy memory cell which increases a threshold voltage of the dummy memory cell through injection disturb.

4. The apparatus of claim 1, wherein:
the timing circuit, to perform the charge loss countermeasure for the data memory cell, is configured to increase a magnitude of a rate of the decrease of the control gate voltage of the data memory cell when the detection circuit detects that the data memory cell is adjacent to the dummy memory cell compared to when the detection circuit detects that the data memory cell is not adjacent to the dummy memory cell.

5. The apparatus of claim 1, wherein:
the timing circuit, to perform the charge loss countermeasure for the data memory cell, is configured to decrease a magnitude of a rate of the decrease of the control gate voltage of the dummy memory cell from the pass level when the detection circuit detects that the data memory cell is adjacent to the dummy memory cell compared to when the detection circuit detects that the data memory cell is not adjacent to the dummy memory cell.

6. The apparatus of claim 5, wherein:
the timing circuit is configured to provide a relatively larger magnitude of the rate of the decrease of the control gate voltage of the dummy memory cell when a temperature is relatively lower.

7. The apparatus of claim 1, wherein:
the timing circuit, to perform the charge loss countermeasure for the data memory cell, is configured to delay a decrease of the control gate voltage of the dummy memory cell relative to the decrease of the control gate voltage of the data memory cell.

8. The apparatus of claim 1, wherein:
the timing circuit, to perform the charge loss countermeasure for the data memory cell, is configured to adjust a timing of the decrease of the control gate voltage of the data memory cell relative to a timing of the decrease of the control gate voltage of the dummy memory.

9. The apparatus of claim 1, further comprising:
a bit line voltage circuit configured to perform a charge loss countermeasure for the data memory cell in response to the detection circuit detecting that the data memory cell is adjacent to the dummy memory cell, wherein:
the set of series-connected memory cells is connected to a bit line; and
the bit line voltage circuit, to perform the charge loss countermeasure for the data memory cell, is configured to instruct the power control circuit to provide a higher voltage on the bit line during the decrease of the control gate voltage of the data memory cell when the detection circuit detects that the data memory cell is adjacent to the dummy memory cell than when the detection circuit detects that the data memory cell is not adjacent to the dummy memory cell.

10. The apparatus of claim 9, wherein:
the bit line voltage circuit is configured to instruct the power control circuit to set the voltage on the bit line relatively higher when an assigned data state of the data memory cell is relatively higher.

* * * * *